(12) United States Patent
Kouketsu et al.

(10) Patent No.: US 9,127,359 B2
(45) Date of Patent: *Sep. 8, 2015

(54) LIQUID VAPORIZER

(71) Applicant: CKD CORPORATION, Komaki-shi, Aichi (JP)

(72) Inventors: Masayuki Kouketsu, Komaki (JP); Hiroshi Itafuji, Komaki (JP)

(73) Assignee: CKD CORPORATION, Komaki-shi, Aichi (JP)

( * ) Notice: Subject to any disclaimer, the term of this patent is extended or adjusted under 35 U.S.C. 154(b) by 233 days.

This patent is subject to a terminal disclaimer.

(21) Appl. No.: 13/945,710

(22) Filed: Jul. 18, 2013

(65) Prior Publication Data

US 2013/0298834 A1 Nov. 14, 2013

Related U.S. Application Data

(63) Continuation of application No. PCT/JP2011/069960, filed on Sep. 1, 2011.

(30) Foreign Application Priority Data

Jan. 19, 2011 (JP) .................. 2011-009193

(51) Int. Cl.
*C23C 16/00* (2006.01)
*C23C 16/448* (2006.01)
(Continued)

(52) U.S. Cl.
CPC .............. *C23C 16/4482* (2013.01); *B01B 1/00* (2013.01); *B01B 1/005* (2013.01); *B01D 1/14* (2013.01); *B01F 3/022* (2013.01); *C23C 14/24* (2013.01); *H01L 21/67017* (2013.01)

(58) Field of Classification Search
CPC ...... C23C 16/4482; C23C 14/24; B01B 1/005

USPC .................................. 118/726, 727
See application file for complete search history.

(56) References Cited

U.S. PATENT DOCUMENTS 8,361,231 B2 1/2013 Kouketsu et al.
8,840,049 B2 9/2014 Kouketsu et al.
(Continued)

FOREIGN PATENT DOCUMENTS

JP 49-52175 5/1974
JP 05-156448 6/1993
(Continued)

OTHER PUBLICATIONS

U.S. Appl. No. 13/630,987, filed Sep. 28, 2012.
(Continued)

*Primary Examiner* — Keath Chen
(74) *Attorney, Agent, or Firm* — Beyer Law Group LLP

(57) ABSTRACT

A liquid vaporizer is configured to vaporize a liquid reagent and mix the vaporized liquid reagent with a gaseous medium. The liquid vaporizer is equipped with a main vaporizer body having a mixed gas generating space, and a vaporizing unit disposed inside the mixed gas generating space. The vaporizing unit has a vaporizing unit main body having a vaporization surface and a net-shaped body formed in a planar shape by knitting wires regularly in a net-like shape. The net-shaped body forms a plurality of mesh spaces surrounded by the wires and arranged regularly in the in-plane direction. The vaporizing unit forms a plurality of liquid reagent supply spaces surrounded by the wires and the vaporization surface as a result of the net-shaped body and the vaporization surface being abutted against each other. The liquid reagent supply spaces are arranged regularly in the in-plane direction of the net-shaped body.

16 Claims, 17 Drawing Sheets

(51) Int. Cl.
*C23C 14/24* (2006.01)
*B01B 1/00* (2006.01)
*B01F 3/02* (2006.01)
*B01D 1/14* (2006.01)
*H01L 21/67* (2006.01)

(56) References Cited

U.S. PATENT DOCUMENTS

| | | |
|---|---|---|
| 2002/0003933 A1 | 1/2002 | Sherrer et al. |
| 2005/0006609 A1 | 1/2005 | Fukano |
| 2007/0101940 A1 | 5/2007 | Iizuka |
| 2012/0180724 A1 | 7/2012 | Kouketsu et al. |
| 2013/0081712 A1 | 4/2013 | Kouketsu et al. |
| 2013/0193230 A1 | 8/2013 | Kouketsu et al. |
| 2014/0015151 A1 | 1/2014 | Kouketsu et al. |

FOREIGN PATENT DOCUMENTS

| | | |
|---|---|---|
| JP | 06-132209 | 5/1994 |
| JP | 6-232035 | 8/1994 |
| JP | 7-47201 | 2/1995 |
| JP | 07-155584 | 6/1995 |
| JP | 09-152287 | 6/1997 |
| JP | 9-186107 | 7/1997 |
| JP | 09-327257 | 12/1997 |
| JP | 10-337464 | 12/1998 |
| JP | 2001-295050 | 10/2001 |
| JP | 2002-228117 | 8/2002 |
| JP | 2004-115920 | 4/2004 |
| JP | 2005-57193 | 3/2005 |
| JP | 2006-352001 | 12/2006 |
| JP | 2008-263244 | 10/2008 |
| JP | 2009-38047 | 2/2009 |
| JP | 2009-194246 | 8/2009 |
| JP | 4673449 | 1/2011 |
| WO | WO 2004/092622 | 10/2004 |

OTHER PUBLICATIONS

U.S. Appl. No. 13/631,003, filed Sep. 28, 2012.
International Search Report dated Nov. 29, 2011 from International Application No. PCT/JP2011/069960.
Office Action in U.S. Appl. No. 13/630,987 dated Oct. 7, 2014.
Office Action dated Jun. 6, 2015 from Japanese Application No. 2012-553555.

LIQUID VAPORIZER

CLAIM OF PRIORITY

The present application is a Continuation of International Application No. PCT/JP2011/069960 filed on Sep. 1, 2011, which claims benefit of Japanese Patent Application No. 2011-009193 filed Jan. 19, 2011. The entire contents of each application noted above are hereby incorporated by reference.

BACKGROUND OF INVENTION

1. Field of Invention

The present invention relates to a liquid vaporizer that vaporizes a liquid reagent.

2. Description of the Related Art

Treatment of a Wafer surface is generally carried out in the production of semiconductor devices in order to increase the adhesion of a resist liquid to the wafer. The treatment of the wafer surface is carried out by using a vaporizer to vaporize a liquid reagent that serves to convert the hydrophilic surface into a hydrophobic surface and by coating the wafer in a chamber. The vaporizer used in such a case vaporizes at normal temperature the liquid reagent for hydrophobization treatment that is stored in a storage tank by bubbling the liquid reagent with nitrogen gas, as described in Japanese Patent Application Publication No. H6-132209. The vapor of the liquid reagent vaporized at a normal temperature is transported from the storage tank into the chamber together with nitrogen gas by using, for example, a resin tube.

Since such a storage tank typically should be of a large size, it cannot be disposed in the vicinity of the chamber and is arranged at a remote location (for example, at a distance equal to or larger than 5 m from the chamber). The vapor of the liquid reagent is easily condensed inside the resin tube and is a cause of forming particles. Therefore, the heating of the resin tube for long-distance transportation of the vapor is required. Meanwhile, since the bubbling of the liquid reagent with nitrogen gas is carried out in the vaporization at a normal temperature, the severity of the condensation problem is increased and the liquid reagent is degraded due to exposure to the nitrogen gas.

In another method for vaporizing a liquid reagent, highly efficient vaporization is performed by increasing the surface area of the liquid reagent by converting the liquid reagent into mist. However, when such conversion into mist is used, the remaining mist is a cause of creating particles. Accordingly, a method for removing the remaining mist as foreign matter with a filter member such as a mesh has been suggested, as described in Japanese Patent Application Publication No. 2008-263244. A method using the separation function of meshes has also been suggested to separate a gas phase from a liquid phase with a mesh allowing only gases to pass therethrough in a gravity-free state (or under very small gravity) and to vaporize from the separation surface by vapor pressure created by heating, as described in Japanese Patent Application Publication No. H05-156448.

However an increase in size of a vaporizer in each of the abovementioned methods is unavoidable so that the vaporizer cannot be disposed in the vicinity of the chamber, and those methods are the same in that the heating of a long resin tube for transporting the mixed gas is required.

BRIEF DESCRIPTION OF THE INVENTION

The present invention has been created to resolve at least some of the above-described problems, and it is an object of the present invention to provide a small-size vaporizer.

The effective implementations for resolving the above-mentioned problems will be explained below while indicating, as necessary, the effect obtained.

In the first implementation, a liquid vaporizer configured to vaporize a liquid reagent supplied from a liquid reagent supply port and mix the vaporized liquid reagent with a gaseous medium is provided. The liquid vaporizer includes a main vaporizer body having a gas introducing port for introducing the gaseous medium, a mixed gas generating space for generating a mixed gas by mixing the vaporized liquid reagent with the gaseous medium introduced from the gas introducing port, and a gas discharge port for discharging the mixed gas. The liquid vaporizer further includes a vaporizing unit disposed inside the mixed gas generating space and configured to vaporize the supplied liquid reagent. The vaporizing unit has a main vaporizing unit body having a vaporization surface formed on the main vaporizing unit body and a net-shaped body formed in a planar shape by knitting wires regularly in a net-like shape. The net-shaped body forms a plurality of mesh spaces surrounded by the wires and arranged regularly in an in-plane direction of the net-shaped body. And the vaporizing unit forms a plurality of liquid reagent supply spaces surrounded by the wires and the vaporization surface as a result of the net-shaped body and the vaporization surface being abutted against each other. The liquid reagent supply spaces are arranged regularly in the in-plane direction of the net-shaped body.

The liquid vaporizer in the first implementation has a net-shaped body formed in a planar shape by knitting wires regularly in a net-like shape. Since the net-shaped body forms a plurality of mesh spaces that are arranged regularly in the in-plane direction of the net-shaped body, a capillary effect of the net-shaped body can be actuated such that a uniform thin-film-forming state of the liquid reagent is realized in the plane of the net-shaped body. In the plurality of mesh spaces, the capillary effect is generated by intermolecular forces acting between the liquid reagent and the wires and the liquid reagent film is formed. Where the uniform thin-film-forming state of the liquid reagent can be formed by the plurality of mesh spaces, the surface area of the liquid reagent is greatly expanded, thereby making it possible to realize a large vaporization amount.

The formation and maintenance of the uniform thin-film-forming state of the liquid reagent is realized by supplying the liquid reagent from the liquid reagent supply spaces. The liquid reagent supply spaces are formed as spaces surrounded by the wires and the vaporization surface as a result of the net-shaped body and the vaporization surface being abutted against each other. Since the liquid reagent supply spaces are arranged regularly in the in-plane direction of the net-shaped body, the liquid reagent can be uniformly supplied in the in-plane direction (two-dimensionally) of the net-shaped body along the wires and the vaporization surface mainly by the following two mechanisms.

The first reason is that at the positions where the vertical wires extending in one direction intersect the transverse wires extending in the other direction, either the vertical wires or the transverse wires are separated from the vaporization surface and therefore a space for the liquid reagent flow is ensured. As a result, the liquid reagent can flow smoothly along the longitudinal direction of the wires. The second reason is that at the intersection positions of the vertical wires and transverse wires, the liquid reagent flow can smoothly divide into a flow along the vertical wires and a flow along the transverse wires and therefore the liquid reagent is supplied uniformly and two-dimensionally. As a result, the liquid reagent can be smoothly supplied in response to the decrease in the amount of the liquid reagent held in the liquid reagent holding spaces caused by the evaporation of the liquid reagent. A state in which a uniform thin film of the liquid reagent is formed is maintained by the synergetic functioning of those two effects.

Thus, in the vaporizing unit of the liquid vaporizer according to the first implementation, the uniform thin-film-forming state of the liquid reagent can be maintained, under conditions of evaporation, by the synergetic action of the plurality of mesh spaces (thin film formation function) and the liquid reagent supply spaces (liquid reagent supply function) arranged regularly in the in-plane direction of the net-shaped body. The present configuration is realized due to the regularity of the outer shape of the net-shaped body formed in a planar shape by knitting wires regularly in a net-like shape. That is, since the net-shaped body is formed by knitting wires regularly in a net-like shape, the mesh spaces and the liquid reagent supply spaces are arranged regularly in the in-plane direction of the net-shaped body. Therefore, the formation of a uniform thin film and the uniform supply of the liquid reagent are realized by the capillary inflow.

Such a configuration is substantially different from the method of forming tubular sections three-dimensionally and randomly by using a foamed body or an aggregation of granular substance, and thereby expanding a vaporization surface for the liquid reagent. Further, the above implementation of the present invention can demonstrate the following useful effects that could not be attained with the conventional techniques. Thus, the problem of degradation of the liquid reagent caused by the liquid reagent remaining inside the foamed body or the aggregation of granular substance can be resolved, the efficiency of evaporation is greatly increased, and the size is reduced due to increased efficiency of vaporization.

The liquid reagent supply spaces have a broad meaning, it is not always necessary that the closed spaces that are entirely surrounded by the wires and the vaporization surface be formed, and the spaces may be partially opened. More specifically, for example, the spaces that are formed in a partially opened state in which the wires are arranged regularly in the vicinity of the vaporization surface are also included in the meaning of the liquid reagent supply spaces. This is because the spaces surrounded in a partially opened state also allow the liquid reagent to pass therethrough and generate the capillary effect.

The cross-sectional shape of the wires should not necessarily be a true circle and may be elliptical or polygonal (tetragonal or hexagonal). Further, the abutment may be also realized by a method of applying, for example, a magnetic force, an adhesive force, or a pressure created by a coarse structural member, or may be generated in the following manner.

The second implementation: In the first implementation of the liquid vaporizer, the vaporization surface is formed as part of an outer circumferential surface of a columnar body, and the net-shaped body is wound along an outer circumferential of the columnar body.

In the second implementation of the liquid vaporizer, the vaporization surface is formed as part of the outer circumferential surface of the columnar body, and the net-shaped body is wound along an outer circumferential of the columnar body. Therefore, the net-shaped body formed in a planar shape by knitting wires regularly in a net-like shape can be wound smoothly and without a gap along the outer circumferential surface. As a result, the abutment of the vaporization surface and the net-shaped body can be easily realized.

The third implementation: In the second implementation of the liquid vaporizer, the vaporizing unit has a tension generating unit configured to generate tension in the net-shaped body along the outer circumferential direction of the columnar body.

In the third implementation of the liquid vaporizer, the vaporizing unit has a tension generating unit that generates tension in the net-shaped body along the outer circumferential direction of the columnar body. Therefore, the loosening of the net-shaped body caused by changes in thermal environment or changes with time (for example, plastic deformation or creep of the net-shaped body) can be inhibited. As a result, mutual abutment of the net-shaped body and the vaporization surface can be reliably maintained.

The fourth implementation: In any one of the first to third implementations of the liquid vaporizer described above, the vaporization surface includes a continuous curved surface formed by connection of convex surfaces protruding in an out-of-plane direction of the net-shaped body. In the vaporizing unit, the net-shaped body and the vaporization surface are abutted against each other by generating tension with respect to the net-shaped body along the continuous curved surface.

In the fourth implementation of the liquid vaporizer, the net-shaped body and the vaporization surface are abutted against each other by generating tension with respect to the net-shaped body along the convex continuous curved surface protruding in the out-of-plane direction on a side of the net-shaped body. Therefore, the occurrence of loosening or wrinkling in the net-shaped body can be inhibited and uniform abutment can be realized. For example, a columnar shape or a three-dimensional shape such as a semispherical shape can be used as the shape of the continuous curved surface.

The fifth implementation: In the fourth implementation of the liquid vaporizer, the vaporization surface further includes a liquid reagent supply surface formed as a flat surface to which the liquid reagent is supplied, and a pair of the continuous curved surfaces that are connected to the flat surface at positions sandwiching the liquid reagent supply surface. In the vaporizing unit, the flat surface sandwiched by the pair of continuous curved surfaces and the net-shaped body are abutted against each other by generating tension with respect to the net-shaped body along the pair of continuous curved surfaces.

In the fifth implementation of the liquid vaporizer, the liquid reagent supply surface sandwiched by the pair of continuous curved surfaces and the net-shaped body are abutted against each other by generating tension with respect to the net-shaped body along the pair of continuous curved surfaces. Therefore, a wide vaporization surface can be easily formed.

The sixth implementation: In any one of the first to fifth implementations of the liquid vaporizer, a liquid reagent discharge port for supplying the liquid reagent to the vaporization surface is formed in the vaporization surface abutting against the net-shaped body.

In the sixth implementation of the liquid vaporizer, the liquid reagent discharge port is formed in the vaporization surface that abuts against the net-shaped body. Therefore, the liquid reagent can be supplied into the gaps between the vaporization surface and the net-shaped body. Since the gaps between the vaporization surface and the net-shaped body are surrounded by the liquid reagent holding spaces and formed as associations of the liquid reagent supply spaces, the liquid reagent can be smoothly supplied to the liquid reagent supply spaces in a state in which the scattering of the liquid reagent is inhibited by the surface tension in the liquid reagent holding spaces.

The seventh implementation: In any one of the first to fifth implementations of the liquid vaporizer, liquid reagent discharge port for supplying the liquid reagent to the vaporization surface is disposed at a position separated from the net-shaped body by a predetermined distance in an out-of-plane direction of the net-shaped body. The predetermined distance is a distance less than a diameter of a droplet of the liquid reagent formed by surface tension in the liquid reagent discharge port.

In the seventh implementation of the liquid vaporizer, the liquid reagent discharge port is disposed at a distance from the net-shaped body less than the diameter of a droplet of the liquid reagent formed by surface tension in the liquid reagent discharge port. Therefore, it is possible to inhibit the generation of particles caused by the adhesion of the liquid reagent to the circumference of the liquid reagent discharge port due to the liquid droplets formed at the distal end of the liquid reagent discharge port. This is because the net-shaped body can inhibit the generation of large liquid droplets by absorbing the liquid reagent by the capillary effect.

The eighth implementation: In the sixth or seventh implementation of the liquid vaporizer, the main vaporizing unit body has a heating unit inside the main vaporizing unit body.

In the eighth implementation of the liquid vaporizer, since the heating unit is provided inside the main vaporizing unit body, heat can be efficiently supplied to a region where the net-shaped body and the vaporization surface formed in the main vaporizing unit body are abutted against each other.

The ninth implementation: In the sixth implementation of the liquid vaporizer, the main vaporizing unit body has a control valve configured to control the supply of the liquid reagent to the liquid reagent discharge port, a liquid reagent discharge flow channel connecting the liquid reagent discharge port to the control valve, and a plurality of heating units disposed at positions sandwiching the liquid reagent discharge flow channel.

In the ninth implementation of the liquid vaporizer, the supply of the liquid reagent can be cut off in the vicinity of the liquid reagent discharge port. Therefore, the problem of the liquid reagent being supplied with a delay after the supply of the liquid reagent has been stopped can be avoided and the spread in the liquid reagent supply amount caused by the generation of bubbles inside the liquid reagent supply path can be inhibited. With this implementation of the present invention, since a pair of heating units is disposed at positions sandwiching the liquid reagent discharge flow channel, the liquid reagent inside the flow channel within a range leading to the liquid reagent discharge port can be vaporized practically without a delay after the liquid reagent has been cut off. As a result, accurate supply of the liquid reagent can be realized.

The tenth implementation: In the ninth implementation of the liquid vaporizer, the main vaporizer body has an outer tubular section forming the mixed gas generating space as a columnar space of a first columnar shape. The main vaporizing unit body has an inner tubular section disposed inside the mixed gas generating space. The inner tubular section has a contour of a second columnar shape with an axial line parallel to an axial line of the first columnar shape, and has formed with a liquid reagent supply flow channel in the axial line direction of the second columnar shape. A valve actuator mounted on the inner tubular section through the outer tubular section in a direction perpendicular to the axial line of the first columnar shape is provided. And the valve actuator has a valve element configured to control a communication state of the liquid reagent supply flow channel and the liquid reagent discharge flow channel.

In the tenth implementation of the liquid vaporizer, a double-wall tubular structure is constituted by the main vaporizer body having an outer tubular section transporting the gaseous medium and the main vaporizing unit body having an inner tubular section transporting the liquid reagent, and therefore enables the installation with high volume efficiency. Meanwhile, in the inner tubular section, the cut-off valve that is configured integrally as a result of using the valve actuator is installed and the volume efficiency is further increased. Since the valve actuator is mounted in the direction perpendicular to the axial line of the double-wall tubular structure, the installation can be performed without increasing the entire length in the axial line direction of the double-wall tubular structure.

The eleventh implementation: In the tenth implementation of the liquid vaporizer, the liquid reagent discharge port is disposed between the gas introducing port and the gas discharge port in the axial line direction of the first columnar shape.

In the eleventh implementation of the liquid vaporizer, the liquid reagent discharge port is disposed between the gas introducing port and the gas discharge port in the axial line direction of the first columnar shape. Therefore, the liquid reagent vaporized when the liquid reagent is supplied can be efficiently mixed with the gaseous medium, and the mixed gas of the mixed gas generating space can be purged after the supply of the liquid reagent has been stopped.

The twelfth implementation: In the eleventh implementation of the liquid vaporizer, the gas discharge port is disposed at a position such that at least part of the gas discharge port communicates with a space formed in a gap between a bottom surface of the mixed gas generating space of the columnar space of the first columnar shape and a bottom surface of the main vaporizing unit body in the axial line direction of the first columnar shape.

In the twelfth implementation of the liquid vaporizer, at least part of the gas discharge port communicates with a space formed in a gap between a bottom surface of a mixed gas generating space and a bottom surface of the main vaporizing unit body in the axial line direction of the first columnar shape. Therefore, the downstream region of the mixed gas generating space in which stagnation easily occurs can be purged even more efficiently. Meanwhile, since the gas discharge port may be disposed at a position such that at least part of the gas discharge port communicates with a space formed in a gap between a bottom surface of a mixed gas generating space and a bottom surface of the main vaporizing unit body, the communication from the direction perpendicular to the axial line direction is also enabled and purging efficiency can be increased while ensuring the degree of freedom in mounting.

The thirteenth implementation provides a liquid vaporizer configured to vaporize a liquid reagent supplied from a liquid reagent supply port and mixes the vaporized liquid reagent with a gaseous medium. The liquid vaporizer includes a main vaporizer body having a mixed gas generating space for generating a mixed gas by mixing the vaporized liquid reagent with the gaseous medium and a vaporizing unit disposed inside the mixed gas generating space and configured to vaporize the supplied liquid reagent. The vaporizing unit has a main vaporizing unit body having a vaporization surface formed on the main vaporizing unit body and a net-shaped body formed in a planar shape by knitting wires regularly in a net-like shape. The main vaporizing unit body has a heating unit configured to heat the vaporization surface from inside the main vaporizing unit body, a gaseous medium flow channel through which the gaseous medium is caused to flow, a gas introducing port for introducing the gaseous medium flowing through the gaseous medium flow channel into the mixed gas generating space, a gas discharge port for discharging the mixed gas from the mixed gas generating space, and a mixed gas flow channel through which the mixed gas discharged from the gas discharged port is caused to flow. The net-shaped body forms a plurality of mesh spaces surrounded by the wires and arranged regularly in an in-plane direction of the net-shaped body, and the vaporizing unit forms a plurality of liquid reagent supply spaces surrounded by the wires and the vaporization surface as a result of the net-shaped body and the vaporization surface being abutted against each other. The liquid reagent supply spaces are arranged regularly in the in-plane direction of the net-shaped body.

In the thirteenth implementation of the liquid vaporizer, the main vaporizing unit body has a heating unit that heats the vaporization surface from inside the main vaporizing unit body. Therefore, the temperature of the main vaporizing unit body rises as a result of the vaporization surface being heated by the heating unit. Further, the main vaporizing unit body has a gaseous medium flow channel through which the gaseous medium is caused to flow and a gas introducing port for introducing the gaseous medium flowing through the gaseous medium flow channel into the mixed gas generating space. Therefore, the gaseous medium is heated while passing through the gaseous medium flow channel and introduced from the gas introducing port into the mixed gas generating space, and the vaporization of the liquid can be enhanced. Further, the main vaporizing unit body has a gas discharge port for discharging the mixed gas from the mixed gas generating space, and a mixed gas flow channel through which the mixed gas discharged from the discharged port is caused to flow. Therefore, the mixed gas discharged from the discharge port is heated while flowing through the mixed gas flow channel and the mixed gas can be prevented from condensation.

The fourteenth implementation: In the thirteenth implementation of the liquid vaporizer, the gaseous medium flow channel and the mixed gas flow channel are provided along the heating unit.

In the fourteenth implementation of the liquid vaporizer, the gaseous medium flow channel and the mixed gas flow channel are provided along the heating unit. Therefore, the temperature of the gaseous medium flow channel and the mixed gas flow channel can be efficiently raised. As a result, the heating of the gaseous medium passing through the gaseous medium flow channel and the heating of the mixed gas passing through the mixed gas flow channel can be further enhanced.

The fifteenth implementation: The thirteenth or fourteenth implementation of the liquid vaporizer further includes a liquid reagent discharge port for supplying the liquid reagent to the vaporization surface, wherein the liquid reagent discharge port is disposed between the gas introducing port and the gas discharge port.

In the fifteenth implementation of the liquid vaporizer, the liquid reagent discharge port for supplying the liquid reagent to the vaporization surface is disposed between the gas introducing port and the gas discharge port. Therefore, the vaporized liquid reagent can be efficiently mixed with the gaseous medium when the liquid reagent is supplied, and the mixed gas located in the mixed gas generating space can be efficiently purged after the supply of the liquid reagent has been stopped.

The sixteenth implementation: In the third implementation of the liquid vaporizer, the tension generating unit has a recess formed in the outer circumferential surface of the columnar body so as to extend linearly in an axial line direction of the columnar body, and an insertion member inserted between the main vaporizer body and the net-shaped body so as to engage with the recess.

With the sixteenth implementation of the liquid vaporizer, tension can be generated in the net-shaped body along the outer circumferential surface of the columnar body by using a simple configuration, and the insertion member can be prevented by the recess from displacing.

DESCRIPTION OF EMBODIMENTS OF THE INVENTION

A specific embodiment of the present invention will be explained hereinbelow with reference to the appended drawings. In the present embodiment, the invention is implemented in a liquid reagent supply system for use in a production line of semiconductor devices or the like, and this system will be explained with reference to FIGS. 1 to 13.

Configuration of Liquid Reagent Supply System of the Embodiment

Figure 1:
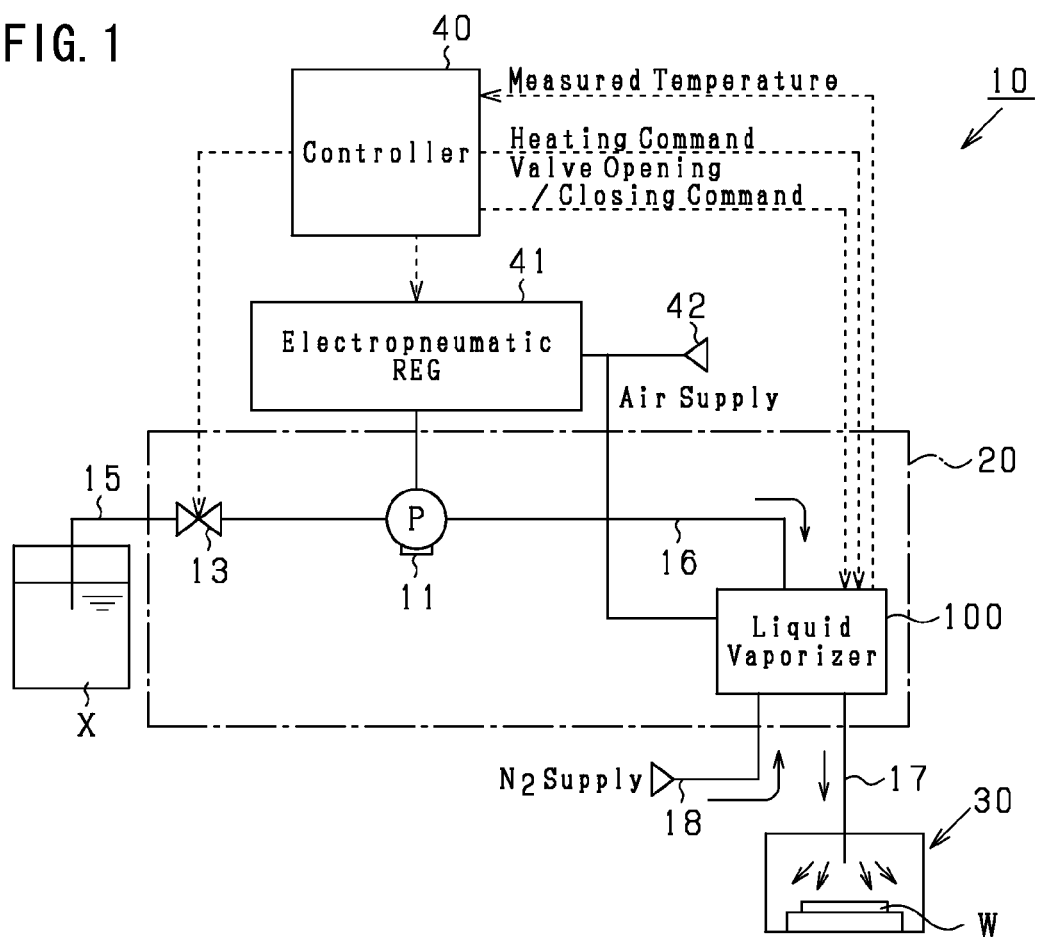
FIG. 1 is a diagram illustrating the configuration of a liquid vaporizing system 10 and a hydrophobization treatment chamber 30 of an embodiment.

FIG. 1 is a diagram illustrating the configuration of a liquid vaporizing system 10 and a hydrophobization treatment chamber 30 of the present embodiment. The liquid vaporizing system 10 is a system that vaporizes a liquid reagent, generates a mixed gas of the vaporized liquid reagent and nitrogen gas, and supplies the mixed gas into the hydrophobization treatment chamber 30. The hydrophobization treatment chamber 30 is a device that applies (scatters) the supplied mixed gas to (over) the surface of a semiconductor wafer W (referred to hereinbelow simply as "wafer") as a pretreatment for liquid resist application in a photolithographic process.

A hydrophobization treatment liquid (hexamethyldisilazane: HMDS) that increases adhesion of liquid resists is used for the liquid reagent. The mixed gas should not necessarily be nitrogen gas and may be another gaseous medium.

The liquid vaporizing system 10 includes a liquid tank X storing the liquid reagent, an intake flow channel 15, a discharge flow channel 17, a nitrogen gas supply path 18, a liquid vaporization device 20, a controller 40 that controls the liquid vaporization device 20, and an electropneumatic regulator 41. The liquid vaporization device 20 vaporizes the liquid reagent that has been sucked in through the intake flow channel 15 from the liquid tank X, mixes the vaporized liquid reagent with nitrogen gas supplied from the nitrogen gas supply path 18, and supplies the mixed gas to the hydrophobization treatment chamber 30 through the discharge flow channel 17.

The liquid vaporization device 20 includes an intake-side valve 13 installed at the intake flow channel 15, a pump 11, a liquid vaporizer 100, and a discharge flow channel 16 for discharging the liquid reagent from the pump 11 to the liquid vaporizer 100. The pump 11 sucks in the liquid reagent from the liquid tank X through the intake flow channel 15 and supplies the liquid reagent from the discharge flow channel 16 to the liquid vaporizer 100. The pump 11 is a diaphragm pump driven by working air supplied from a working air supply source 42 through the electropneumatic regulator 41. The electropneumatic regulator 41 is controlled by the controller 40 in conjunction with an intake-side valve 13 or a discharge-side valve (described hereinbelow) of the liquid vaporizer 100. The electropneumatic regulator 41 is also used for blocking the liquid reagent inside the liquid vaporizer 100.

Configuration of Liquid Vaporizer of the First Embodiment

Figure 2:
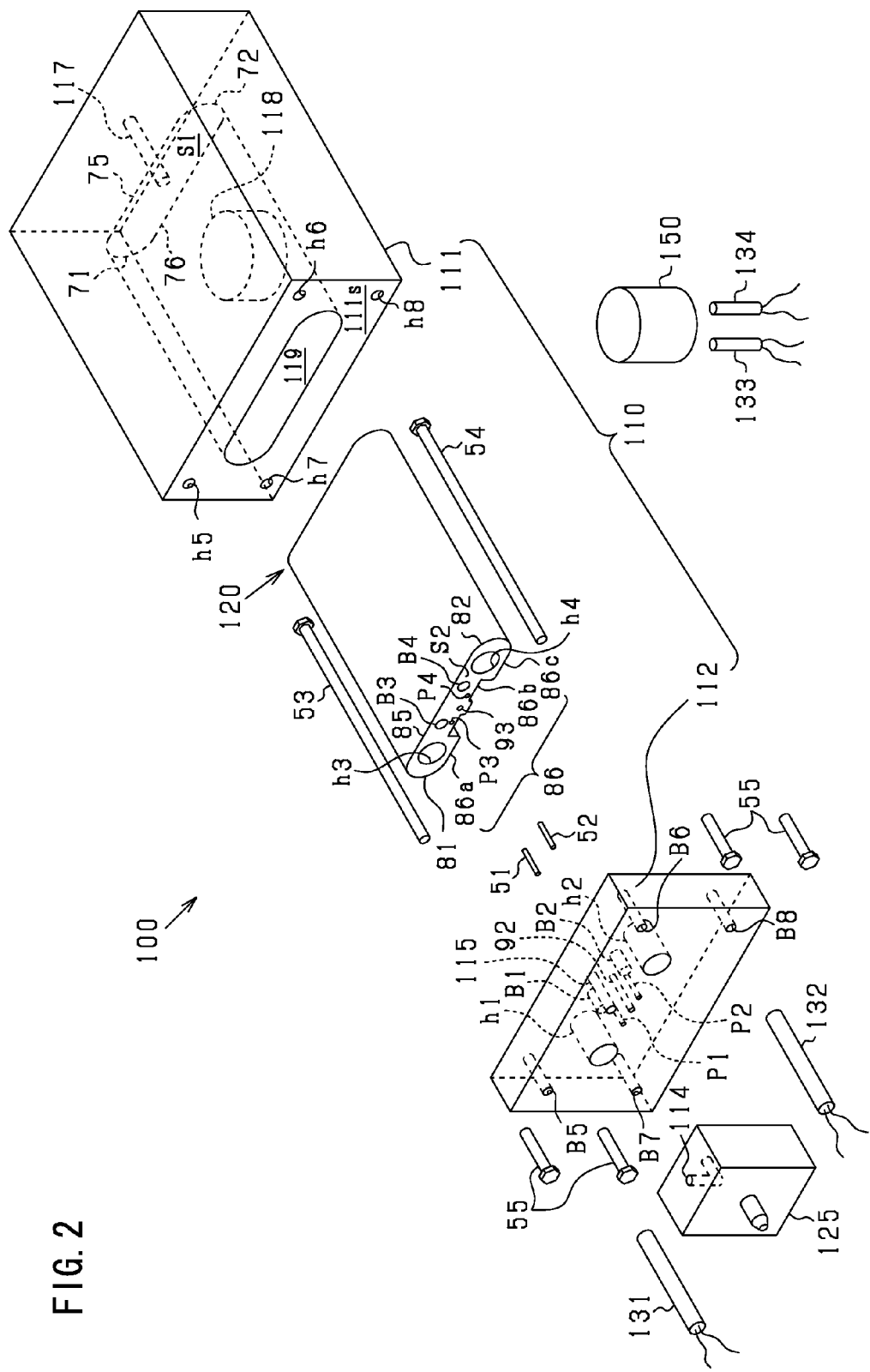
FIG. 2 is an exploded perspective view illustrating the schematic configuration of a liquid vaporizer 100.
Figure 3:
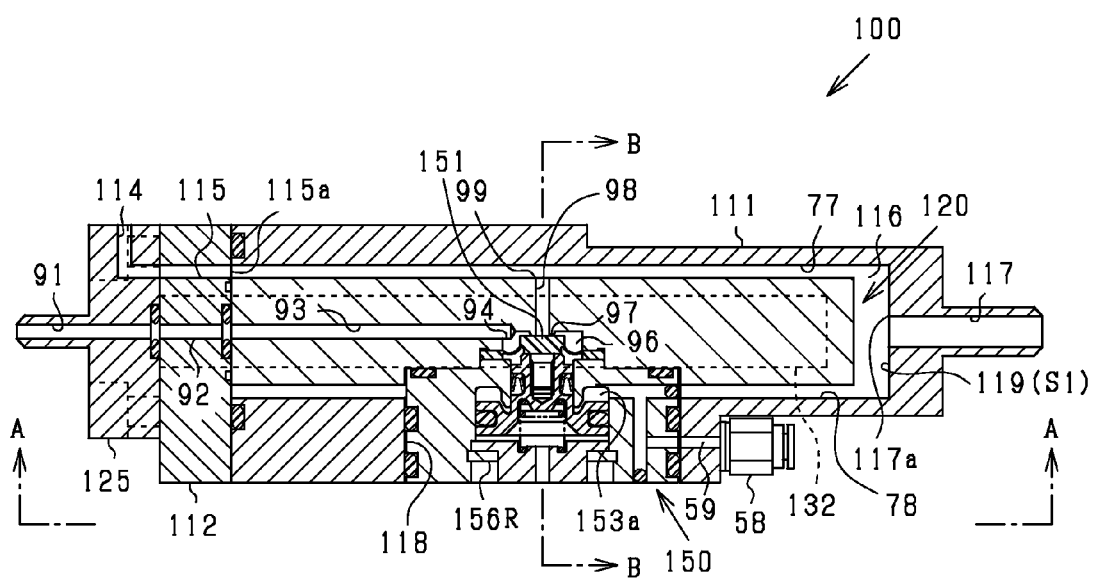
FIG. 3 is an enlarged cross-sectional view illustrating the internal configuration of the liquid vaporizer 100.
Figure 4:
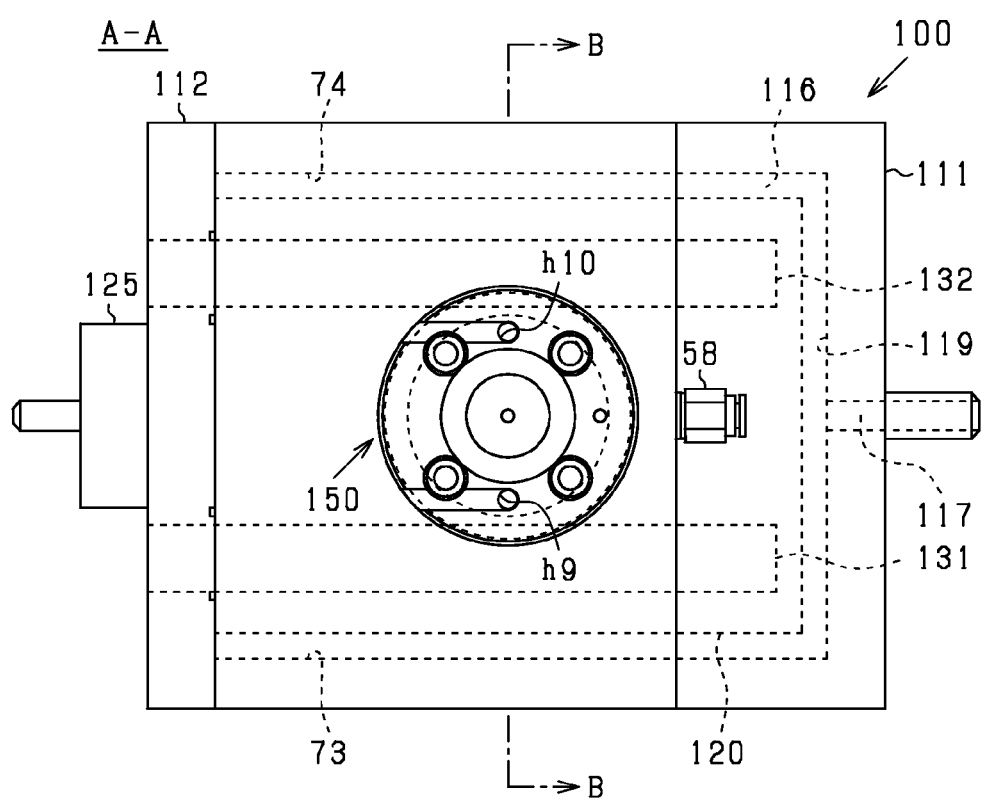
FIG. 4 is an enlarged cross-sectional view illustrating the internal configuration of the liquid vaporizer 100.

FIG. 2 is an exploded perspective view illustrating the schematic configuration of the liquid vaporizer 100. FIG. 3 is a vertical sectional view illustrating the internal configuration of the liquid vaporizer 100. FIG. 4 is a bottom view illustrating the external appearance of the liquid vaporizer 100. The liquid vaporizer 100 includes a main vaporizer body 110, a vaporizing unit 120, a liquid reagent introducing member 125, two heaters 131 and 132, a valve actuator 150, and temperature sensors 133 and 134. The main vaporizer body 110 includes a recessed member 111 having formed therein a columnar recess 119 and a valve actuator mounting hole 118 communicating with the columnar recess 119, and a lid member 112 that seals the columnar recess 119 from the outside of the main vaporizer body 110. The valve actuator mounting hole 118 is formed as a round columnar through hole for mounting the valve actuator 150. The round columnar through hole 118 communicates with the columnar recess 119 orthogonally to the axial direction of the columnar shape of the columnar recess 119.

The liquid vaporizer 100 is assembled by the below-described method. (1) The lid member 112 is mounted on the vaporizing unit 120. (2) The lid member 112 is prefixed to the recessed member 111. (3) The valve actuator 150 is mounted on the vaporizing unit 120 and the recessed member 111. (4) The lid member 112 is fastened to the recessed member 111. (5) The two temperature sensors 133 and 134 are mounted on the vaporizing unit 120. (6) The two heaters 131 and 132 are mounted on the vaporizing unit 120. (7) The liquid reagent introducing member 125 is mounted on the lid member 112.

The mounting of the lid member 112 on the vaporizing unit 120 is performed in the following manner. The lid member 112 and the vaporizing unit 120 are mounted by positioning with a pair of pins 51 and 52 and fastening using a pair of through bolts 53 and 54. The positioning is performed by inserting the pin 51 into a positioning hole P1 of the lid member 112 and a positioning hole P3 of the vaporizing unit 120 and inserting the pin 52 into a positioning hole P2 of the lid member 112 and a positioning hole P4 of the vaporizing unit 120. The fastening is performed by inserting the pair of through bolts 53 and 54 through unloaded holes B3 and B4, respectively, of the vaporizing unit 120 and screwing the bolts 53 and 54 into threaded holes B1 and B2, respectively, of the lid member 112.

The prefixing of the lid member 112 to the recessed member 111 is performed in the following manner. The recessed member 111 is placed with an orientation such that the opening of the columnar recess 119 faces up in the vertical direction. The lid member 112 is abutted against an abutment surface 111s of the recessed member 111, while the vaporizing unit 120 is being inserted from the upper side in the vertical direction into the columnar recess 119. Four bolts 55 are inserted into unloaded holes B5 to B8 of the lid member 112 and screwed into four threaded holes h5 to h8 formed in the recessed member 111. The four bolts B55 are, however, mounted loosely to obtain the prefixed state.

The mounting of the valve actuator 150 on the vaporizing unit 120 and the recessed member 111 is performed in the following manner. The valve actuator 150 is passed through the valve actuator mounting hole 118 of the recessed member 111 and mounted on the vaporizing unit 120 (see FIG. 3 and FIG. 4). The vaporizing unit 120 has already been assembled with the recessed member 111 through the lid member 112, but because of the prefixed state, the assembling tolerance can be absorbed and smoother insertion and fastening of the valve actuator 150 to the vaporizing unit 120 can be realized. The valve actuator 150 is thus mounted on the recessed member 111 and the vaporizing unit 120.

The fastening of the lid member 112 to the recessed member 111 is performed by tightening four bolts 55 (see FIG. 2). When the lid member 112 is fastened to the main vaporizer body 110, the valve actuator 150 moves slightly with respect to the valve actuator mounting hole 118 due to an assembling error. However, the sealed state between the valve actuator 150 and the valve actuator mounting hole 118 is maintained by the elastic deformation of an O-ring (not shown). The diameter of the valve actuator mounting hole 118 is set slightly larger than the diameter of the valve actuator 150 with consideration for the assembling tolerance.

Figure 5:
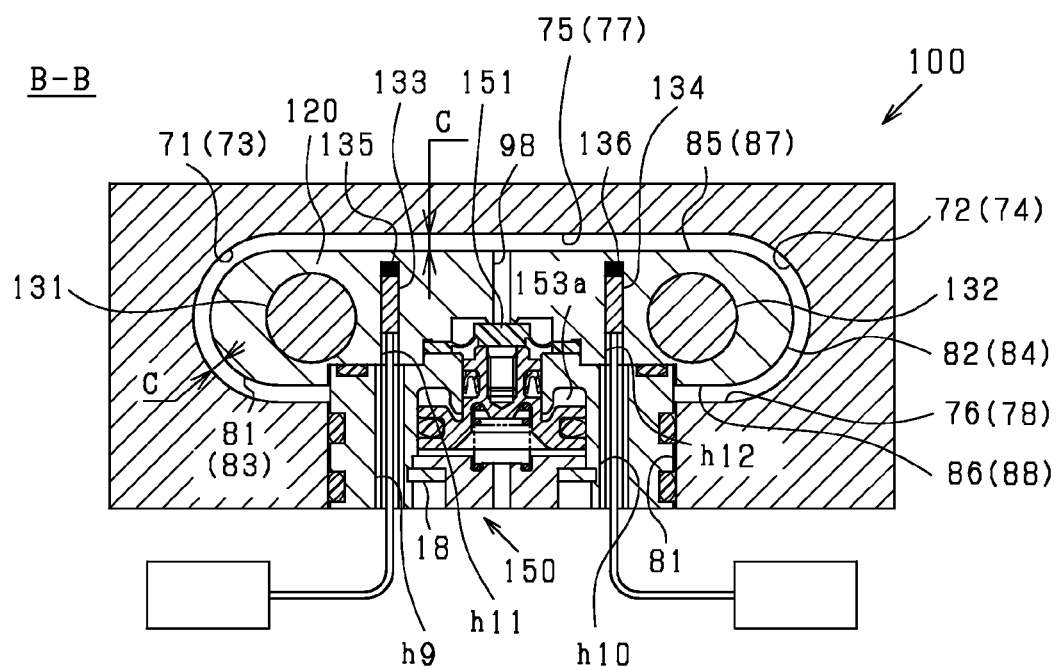
FIG. 5 is a cross-sectional view illustrating the state in which heaters 131 and 132 and temperature sensors 133 and 134 are mounted.

FIG. 5 is a cross-sectional view illustrating the state in which the heaters 131 and 132 and the temperature sensors 133 and 134 are mounted on the liquid vaporizer 100. The mounting of the two heaters 131 and 132 on the vaporizing unit 120 is performed by being inserted into mounting holes h3 and h4 of the vaporizing unit 120 via through holes h1 and h2 (see FIG. 2) of the lid member 112. The temperature sensors 133 and 134 are connected to the controller 40 and inserted into mounting holes h11 and h12 of the vaporizing unit 120 via through holes h9 and h10 of the valve actuator 150. In the mounted state, the temperature sensors 133 and 134 have thermosensitive sections 135 and 136 in the deepest sections of the mounting holes h11 and h12. The thermosensitive section 135 is disposed closer to a vaporization surface 87 than to the heater 131. The thermosensitive section 136 is disposed closer to the vaporization surface 87 than to the heater 132.

Since the thermosensitive sections 135 and 136 are thus disposed closer to the vaporization surface 87 than to the heaters 131 and 132, respectively, temperature variations of the vaporization surface 87 serving as a vaporization surface can be directly detected. Thermocouples having high responsiveness are used as the thermosensitive sections 135 and 136. As a result, the controller 40 can monitor the vaporization state by detecting very small temperature variations occurring when the vaporization is started or ended. The controller 40 energizes the heaters 131 and 132 so that the temperature of the vaporization surface 87 is stabilized at a temperature of about 70 degrees to 100 degrees.

A mixed gas generating space 116 is formed, as will be explained hereinbelow, as a space surrounded by the inner wall of the columnar recess 119, the outer surface of the vaporizing unit 120, and the outer surface of the valve actuator 150.

The inner wall of the columnar recess 119 is formed, as shown in FIG. 2, as a columnar space (hole) with a bottom surface S1 constituted by a pair of semicircles 71 and 72 disposed at mutually facing positions and a pair of parallel lines 75 and 76 connecting the pair of semicircles 71 and 72. Thus, the columnar recess 119 is constituted as a space (hole) surrounded by a pair of outer circumferential surfaces 73 and 74 (FIGS. 3 and 4) corresponding to the pair of semicircles 71 and 72 of the bottom surface S1 and a top surface 77 and a bottom surface 78 (FIGS. 3 and 4) formed as a pair of parallel surfaces corresponding to the pair of parallel lines 75 and 76 of the bottom surface S1. The correspondence, as referred to herein, means the extension in the axial line direction of the columnar shape. The valve actuator mounting hole 118 is formed in the bottom surface 78 and communicates with the columnar recess 119. The inner wall of the columnar recess 119 can be also called a columnar space of the first columnar shape.

The outer surface of the vaporizing unit 120 is formed, as shown in FIG. 5, as a columnar body having a bottom surface S2 (see FIG. 2) surrounded by a pair of semicircles 81 and 82 disposed at mutually opposing positions and an upper straight line 85 and a lower line 86 connecting the pair of semicircles 81 and 82. The pair of semicircles 81 and 82 is configured as semicircles (coaxial lines) with a radius less than that of the pair of semicircles 71 and 72 by a clearance C. The outer surface of the vaporizing unit 120 can be also represented as having a contour of the second columnar shape.

As shown in FIG. 5, the upper straight line 85 is a straight line disposed at a position shifted from the parallel line 75 to the lid member 112 side that is a position closer to the parallel line 76 with respect to the parallel line 75 by the clearance C (on the vertically down side). Meanwhile, the lower line 86 is configured as a curved line including straight lines 86a and 86c (see FIG. 2) disposed at positions that are shifted from the parallel line 76 to the lid member 112 side that is a position closer to the parallel line 76 with respect to the parallel line 75 by the clearance C (on the vertically up side), and a line 86b formed to recede toward the upper straight line 85 side.

The vaporizing unit 120 is formed as a columnar body with an outer circumference formed by a pair of outer circumferential surfaces 83 and 84 (see FIG. 5) corresponding to the pair of semicircles 81 and 82 of the bottom surface S2 (see FIG. 2), the vaporization surface 87 corresponding to the upper straight line 85, and the bottom surface 88 corresponding to the lower line 86. Recesses 122, 123, and 95 (described hereinbelow, see FIG. 6) that communicate with the valve actuator mounting hole 118 and serve for mounting the valve actuator 150 are formed in the bottom surface 88. The vaporization surface 87 plays a central role in vaporization of the liquid reagent.

Thus, the outer circumferential surfaces 83 and 84 of the vaporizing unit 120 are configured as curved surfaces that are offset inward by the clearance C with respect to the outer circumferential surfaces 73 and 74 of the columnar recess 119. The vaporization surface 87 of the vaporizing unit 120 is configured as a flat surface that is offset inward by the clearance C with respect to the top surface 77 of the columnar recess 119. The bottom surface 88 is configured as a surface having a flat surface that is offset inward by the clearance C with respect to the bottom surface 78 of the columnar recess 119.

With such a configuration, the mixed gas generating space 116 is formed in a substantially tubular shape having the thickness of the clearance C by the columnar recess 119 and the vaporizing unit 120.

A nitrogen gas introducing flow channel 114 for introducing nitrogen gas, a mixed gas discharge flow channel 117 for discharging the mixed gas, and a liquid reagent introducing flow channel 91 for supplying the liquid reagent are connected, as will be explained hereinbelow, to the mixed gas generating space 116 as shown in FIG. 3.

The nitrogen gas introducing flow channel 114 is formed in the liquid reagent introducing member 125. The lid member 112 is connected to the liquid reagent introducing member 125, and a nitrogen gas flow channel 115 communicates with the nitrogen gas introducing flow channel 114. The nitrogen gas flow channel 115 is formed in the lid member 112 and communicates with the mixed gas generating space 116 at a nitrogen gas supply port 115a, as shown in FIG. 2 and FIG. 3. The nitrogen gas supply port 115a is formed in the center of the region that is the outer surface of the lid member 112 facing the mixed gas generating space 116 and is sandwiched between the vaporization surface 87 of the vaporizing unit 120 and the top surface 77 of the columnar recess 119.

The nitrogen gas supply port 115a is also called a gas introducing port and should not necessarily be a single port. Thus, a plurality of such ports may be also provided along the annular surface where the outer surface of the lid member 112 is in contact with the mixed gas generating space 116.

The mixed gas discharge flow channel 117 is formed in the recessed member 111 of the main vaporizer body 110 and communicates with the mixed gas generating space 116 at a mixed gas discharge port 117a disposed at the centroid position of the bottom surface S1. The mixed gas discharge port 117a is at the most downstream position of the mixed gas generating space 116. The mixed gas discharge port 117a is also called a gas discharge port.

Thus, the main vaporizer body 110 has formed therein the nitrogen gas introducing flow channel 114, the nitrogen gas flow channel 115, and the nitrogen gas supply port 115a for introducing nitrogen gas into the mixed gas generating space 116, and the mixed gas discharge port 117a and the mixed gas discharge flow channel 117 for discharging the mixed gas of the nitrogen gas and the vaporized liquid reagent from the mixed gas generating space 116.

Meanwhile, a liquid reagent flow channel for introducing the liquid reagent into the mixed gas generating space 116 is configured as described hereinbelow.

FIG. 3 and FIG. 5 show the state in which a diaphragm valve element 151 of the valve actuator 150 closes the liquid reagent flow channel. The liquid reagent flow channel is configured by the valve actuator 150 and the flow channels formed in the liquid reagent introducing member 125, the lid member 112, and the main vaporizing unit body 121 of the vaporizing unit 120.

The flow channels of the liquid reagent communicate in the following manner. The liquid reagent introducing flow channel 91 (see FIG. 3) is formed in the liquid reagent introducing member 125. The liquid reagent introducing flow channel 92 communicating with the liquid reagent introducing flow channel 91 is formed in the lid member 112. The liquid reagent supply flow channel 93 communicating with the liquid reagent introducing flow channel 92 as a result of fastening the main vaporizing unit body 121 to the lid member 112 is formed in the main vaporizing unit body 121. The liquid reagent supply flow channel 93 is connected to a valve chamber 96 through a liquid reagent inflow port 94. A valve seat 97 is formed in the valve chamber 96.

Figure 6:
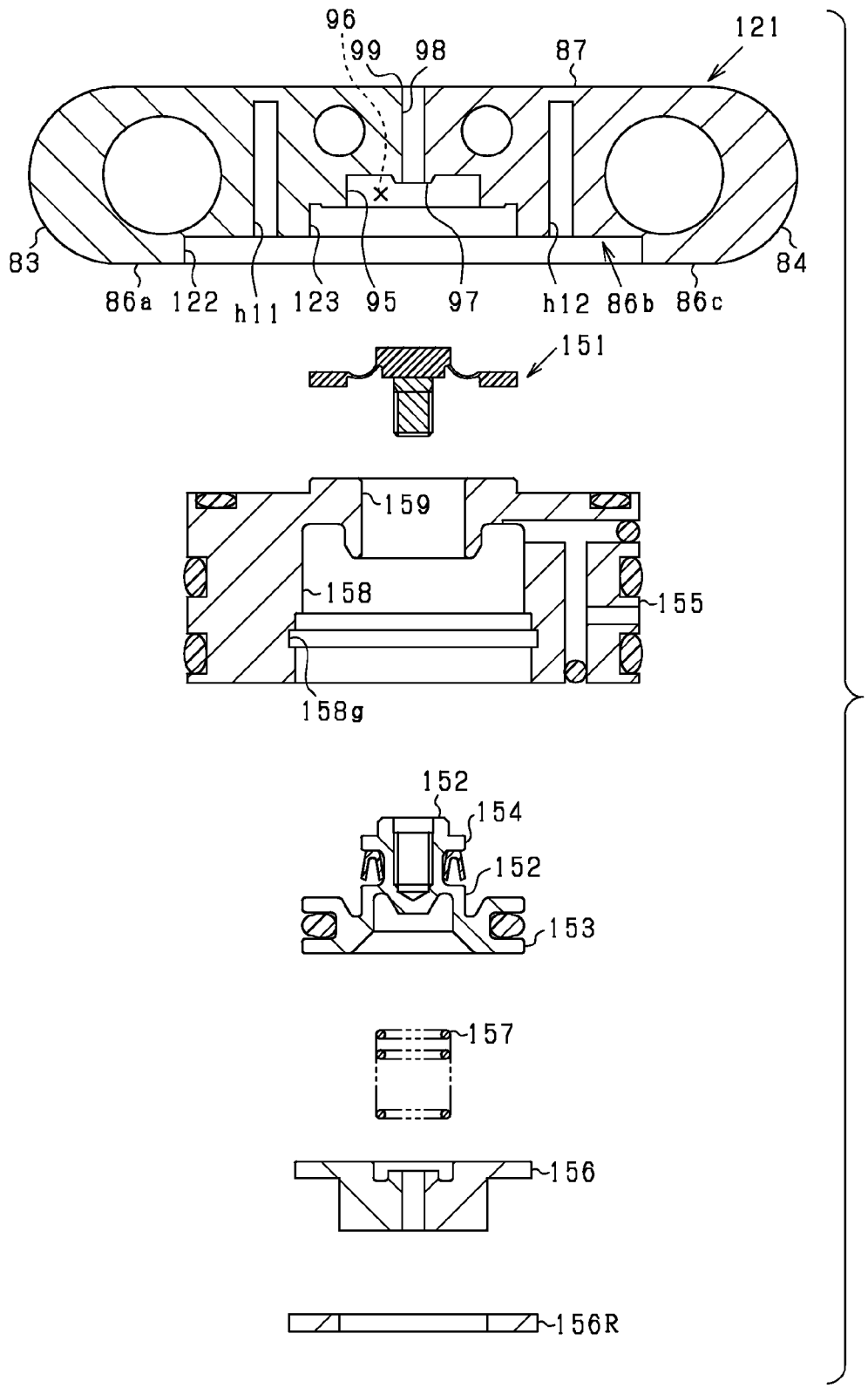
FIG. 6 is an exploded cross-sectional view illustrating the internal configuration of the liquid vaporizer 100.

FIG. 6 is an enlarged and exploded cross-sectional view illustrating the internal configuration of the main vaporizing unit body 121 and the valve actuator 150. The valve chamber 96 is configured by assembling the diaphragm valve element 151 of the valve actuator 150 with the recess 95. Thus, a cut-off valve having the valve chamber 96 is integrally formed in the vaporizing unit 120 by mounting the valve actuator 150 on the vaporizing unit 120. The cut-off valve is also called a control valve. The main vaporizing unit body 121 functions in a state in which the main vaporizing unit body 121 is disposed in a posture such that the vaporization surface 87 is a horizontal surface facing vertically upward.

The liquid reagent discharge port 99 is connected to the valve chamber 96 through the liquid reagent discharge flow channel 98. The liquid reagent discharge port 99 communicates with the mixed gas generating space 116. The liquid reagent discharge port 99 is arranged at a position obtained by shifting the position of the nitrogen gas supply port 115a in a predetermined axial direction in the vaporization surface 87 of the vaporizing unit 120. The predetermined axial direction means the direction in which the nitrogen gas flows and is the axial direction of the mixed gas generating space 116 formed as a tubular columnar space. The vaporization surface 87 is also called a liquid reagent supply surface.

Since the liquid reagent discharge flow channel 98 can be closed at the valve seat 97 in the vicinity of the liquid reagent discharge port 99 by the diaphragm valve element 151, the reduction of the liquid reagent discharge flow channel 98 in length is realized. As a result, the leakage of the liquid reagent resulting from the liquid reagent being pushed out when the liquid reagent is vaporized inside the liquid reagent supply flow channel 93 after the supply of the liquid reagent has been stopped can be effectively inhibited. Meanwhile, since the valve chamber 96 communicates with the liquid reagent discharge flow channel 98 at a position on the vertically upper side, the valve chamber 96 has a shape such that gas bubbles remaining before the liquid reagent is introduced are unlikely to be retained. Such leakage and discharge of gas bubbles are the reasons for the error in the supplied amount of the liquid reagent. Therefore, the merit of the present embodiment is that such an error can be effectively inhibited and the accuracy of the supplied amount of the liquid reagent can be greatly improved.

Meanwhile, since the liquid reagent discharge flow channel 98 is sandwiched by the two heaters 131 and 132, the liquid reagent discharge flow channel 98 can be maintained in a high-temperature state during heating and immediately after the heating. Therefore, since the liquid reagent discharge flow channel 98 is maintained in a high-temperature state, the liquid reagent inside the liquid reagent discharge flow channel 98 can be vaporized immediately after the supply of the liquid reagent has been stopped. As a result, a spread of the vaporized amount of the liquid reagent caused by the delay of vaporization can be inhibited and the accuracy of the supplied amount of the liquid reagent can be increased.

The valve actuator 150 is configured as described below, as shown in FIG. 6. The valve actuator 150 includes the diaphragm valve element 151, a piston rod 152, a spring 157, a main cut-off valve body 155, and a rear lid 156. The piston rod 152 is connected to the diaphragm valve element 151. A sliding section 154 and a piston 153 are formed in the piston rod 152.

The sliding section 154 is a member that slides inside a guide section 159 that is a cylindrical recess formed in the main cut-off valve body 155. The piston 153 is a member that slides inside a cylinder section 158 formed in communication with a guide section 159 inside the main cut-off valve body 155. And the piston 153 compartmentalizes a pressure control chamber 153a (see FIG. 3 and FIG. 5). Working air is supplied from a working air port 58 via a working air flow channel 59 into the pressure control chamber 153a. The working air port 58 is connected to the electropneumatic regulator 41 as shown in FIG. 1.

The piston rod 152 is biased by a spiral coil-shaped spring 157 in the direction of closing the liquid reagent discharge flow channel 98 with the diaphragm valve element 151 and can be operated in the direction of opening the liquid reagent discharge flow channel 98 by pressurization of the pressure control chamber 153a. The spring 157 is fixed at the rear lid 156. The rear lid 156 is fixed by an elastic ring 156R that is engaged with a groove section 158g formed inside the main cut-off valve body 155.

Thus, the present embodiment has a double-wall tubular structure constituted by the main vaporizer body 110 functioning as an outer tubular section transporting the gaseous medium and the main vaporizing unit body 121 functioning as an inner tubular section transporting the liquid reagent, and therefore enables the installation with high volume efficiency. Meanwhile, in the inner tubular section, the cut-off valve that is configured integrally as a result of using the valve actuator is installed and the volume efficiency is further increased. Since the valve actuator is mounted in the direction perpendicular to the axial line of the double-wall tubular structure, the installation can be performed without increasing the entire length in the axial line direction of the double-wall tubular structure.

Another merit of the present configuration is that the flow channel of the mixed gas can be purged by simply stopping the supply of the liquid reagent. Thus, the nitrogen gas supply port 115a can be used for purging the entire flow channel from the mixed gas generating space 116 to the hydrophobization treatment chamber 30 by simply stopping the supply of the liquid reagent and continuing the supply of nitrogen gas from the most upstream position of the mixed gas.

With the conventional method of stopping the vaporization, the vaporization is stopped and started by switching the mixed gas pipe and the nitrogen gas pipe, and therefore when the vaporization is stopped, the retention of the mixed gas occurs in the pipe from the vaporization position such as a bubbling position to a switching valve (not shown in the figure). Since a long pipe for supplying through a long distance from the vaporization position to the chamber is used, the tradeoff problem is encountered. That is, making the switching position close to the chamber causes the retention of the mixed gas over a long distance from the vaporization position to the switching position, whereas making the switching position close to the vaporization position increases a time lag till the mixed gas reaches the chamber when the vaporization is restarted.

However, in the present configuration, the switching of the pipes is not required and no gas retention occurs. Therefore, such a tradeoff problem is resolved and the supply of the mixed gas degraded by the retention is avoided. As a result, the process quality can be increased by ensuring the mixed gas quality.

The configuration of the vaporizing unit 120 will be explained with reference to FIG. 7 to FIG. 10.

Figure 7:
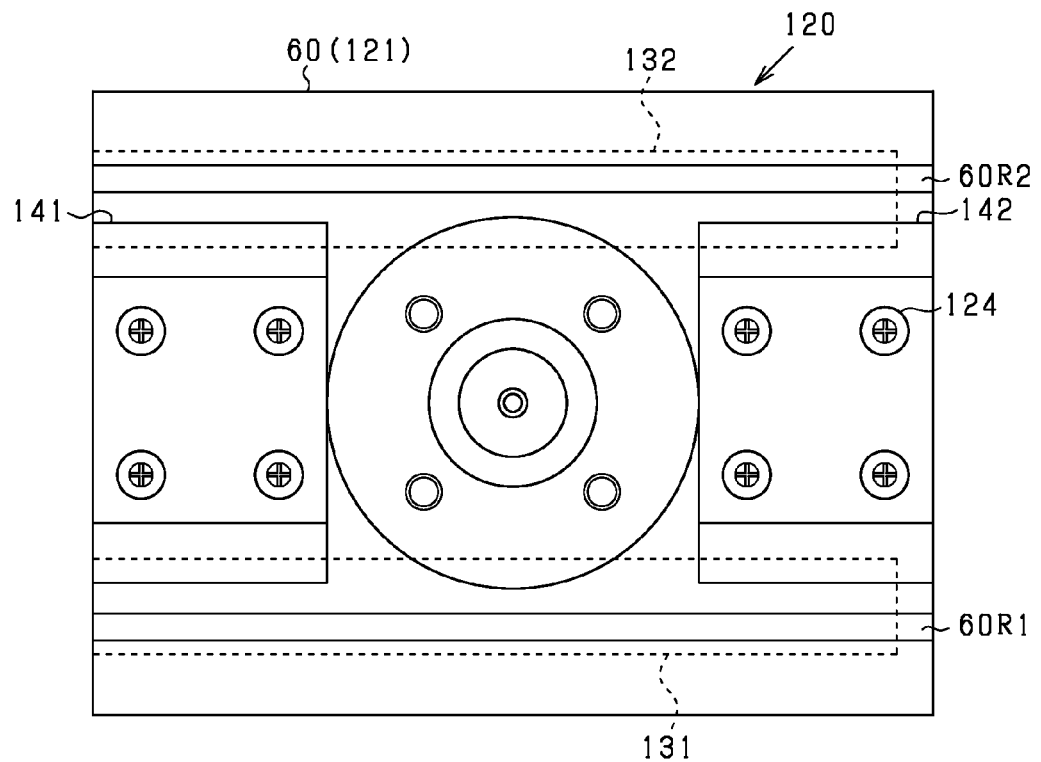
FIG. 7 is a plan view illustrating the external appearance of a vaporizing unit 120.
Figure 8:
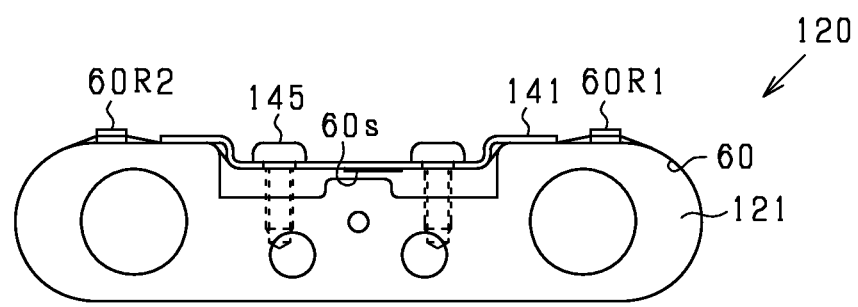
FIG. 8 is a front view illustrating the external appearance of the vaporizing unit 120.
Figure 9:
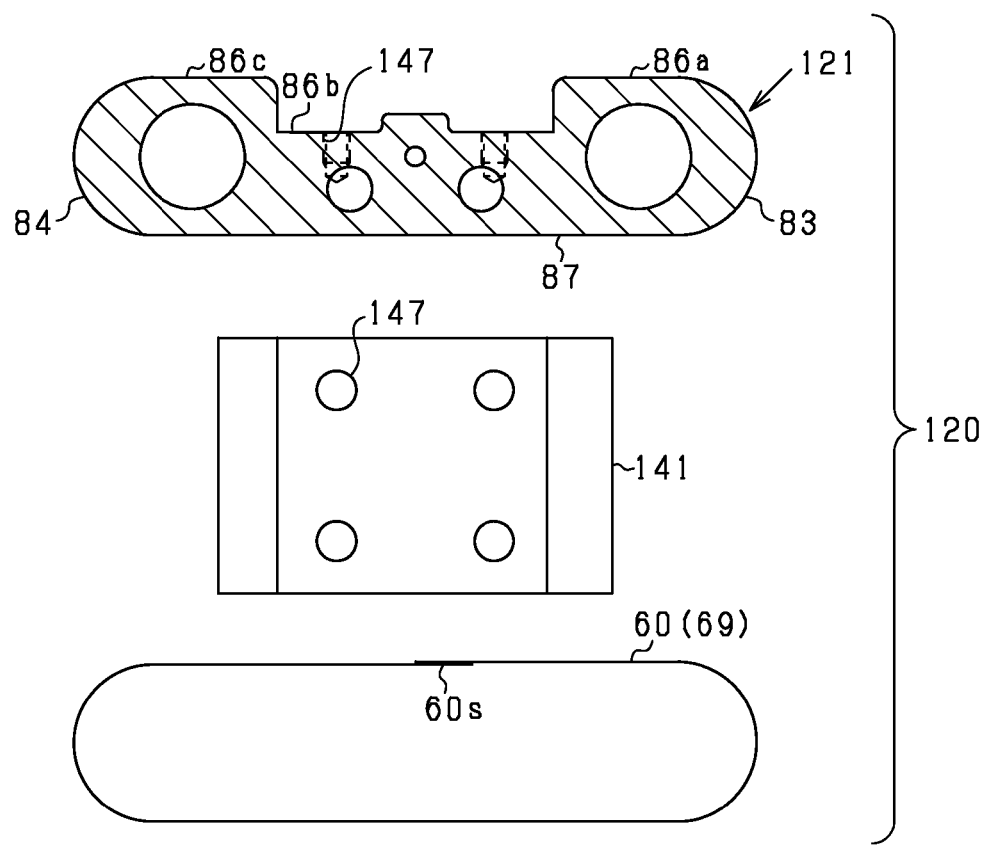
FIG. 9 is a component diagram showing a main vaporizing unit body 121, a tubular mesh 60, and a tension generating member 141 constituting the vaporizing unit 120.
Figure 10:
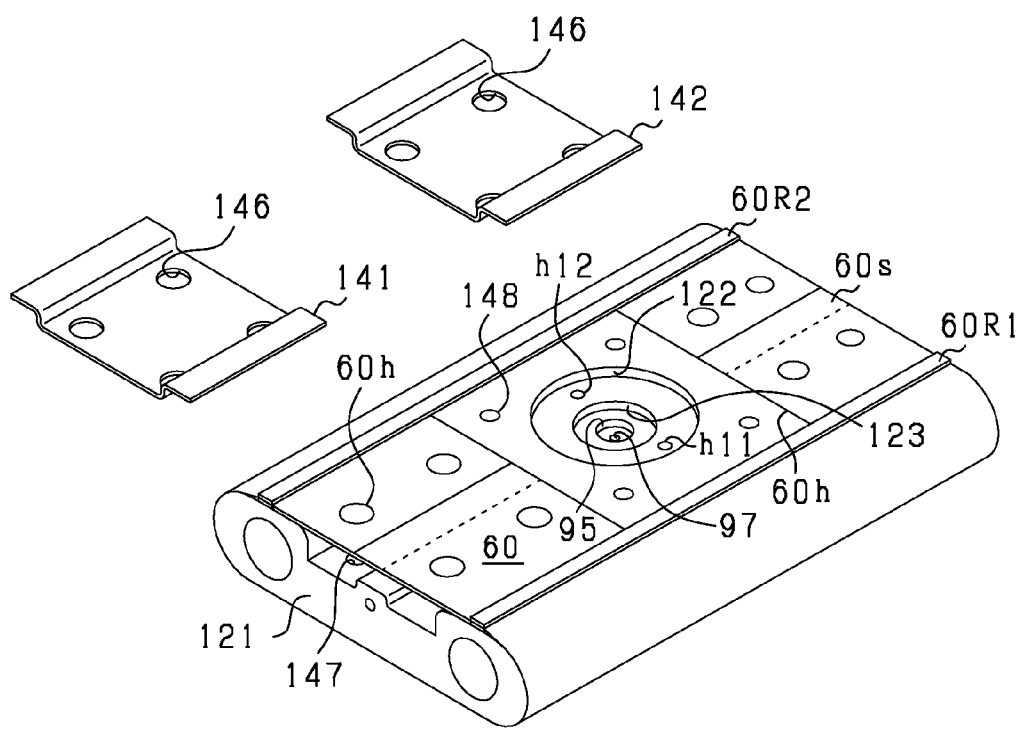
FIG. 10 is a perspective view of external appearance showing a state in the course of assembling the vaporizing unit 120.

FIG. 7 to FIG. 10 show the configuration of the vaporizing unit 120. FIG. 7 is a bottom view illustrating the external appearance of the vaporizing unit 120. FIG. 8 is a front view illustrating the external appearance of the vaporizing unit 120. FIG. 9 is a component diagram showing the main vaporizing unit body 121, a tubular mesh 60, and a tension generating member 141 constituting the vaporizing unit 120. FIG. 10 is a perspective view of external appearance showing a state in the course of assembling the vaporizing unit 120.

As shown in FIG. 9 and FIG. 10, the vaporizing unit 120 includes the main vaporizing unit body 121, the tubular mesh 60, and two tension generating members 141 and 142. The main vaporizing unit body 121 is, for example, made of aluminum having wetting ability with respect to the liquid reagent and has a columnar outer shape, except for the recesses 122, 123, and 95 (see FIG. 6) onto which the valve actuator 150 is to be mounted as mentioned hereinabove.

In the columnar outer shape of the main vaporizing unit body 121, the vaporization surface 87 in which the liquid reagent discharge port 99 is formed in the centroid position and the pair of outer circumferential surfaces 83 and 84 sandwiching the vaporization surface 87 serve as portions of the outer circumferential surface. This outer circumferential surface is covered by the tubular mesh 60. The tubular mesh 60 is obtained by rolling a net-shaped body 69, which is formed in a planar shape by knitting stainless steel wires regularly in a net-like shape, and sewing the net-shaped body at a connection section 60s.

The vaporizing unit 120 is assembled in the following manner, as shown in FIG. 10, before mounting on the lid member 112. (1) The tubular mesh 60 is mounted on the main vaporizing unit body 121, (2) the position of the tubular mesh 60 is adjusted such that the entire recess 122 of the main vaporizing unit body 121 falls within a square notched section (a hole or a cut-out section) 60h formed in the tubular mesh 60. (3) The two tension generating members 141 and 142 are mounted on the main vaporizing unit body 121 (see FIG. 8). The tension generating members 141 and 142 are mounted on the main vaporizing unit body 121 by screwing four screws 145 into eight screw holes 147 of the main vaporizing unit body 121 through holes 146 of the tension generating members 141 and 142. The tension can be adjusted by the screwing amount of the four screws 145.

The tension generating members 141 and 142 generate tension in the circumferential direction with respect to the tubular mesh 60. The tension in the circumferential direction is generated along the outer circumferential surfaces 83 and 84 (see FIG. 9) which are a pair of continuous curved surfaces. Since the outer circumferential surfaces 83 and 84 are continuous with the vaporization surface 87, which is formed with the liquid reagent discharge port 99, at positions sandwiching the vaporization surface 87, the vaporization surface 87 and the tubular mesh 60 are abutted against each other.

Further, since the vaporization surface 87 and the outer circumferential surfaces 83 and 84 are formed as portions of the outer circumferential surface of the columnar body, the tubular mesh 60 can be wound without a gap. As a result, the abutment of the vaporization surface 87 and the tubular mesh 60 is easily realized and loosening of the net-shaped body caused by changes in thermal environment or changes with time (for example, plastic deformation or creep of the net-shaped body) can be inhibited. As a result, the mutual abutment between the net-shaped body 69 and the vaporization surface 87 is reliably maintained.

As shown in FIG. 10, a pair of metallic reinforcing members 60R1 and 60R2 is mounted on the tubular mesh 60. The metallic reinforcing members 60R1 and 60R2 serve for uniformly transferring the tension generated by the tension generating members 141 and 142 in the axial line direction to the tubular mesh 60. The reinforcing member 60R1 includes a pair of members and is fixed to the tubular mesh 60 by sandwiching the tubular mesh 60 from the inner and outer sides by the pair of members. The fixation may be realized by bonding together or welding together the pair of members in a state in which the tubular mesh 60 is sandwiched by the pair of members. As a result, although the tubular mesh 60 is elastic, the tension generating members 141 and 142 can uniformly generate a tension on the vaporization surface 87.

Figure 11:
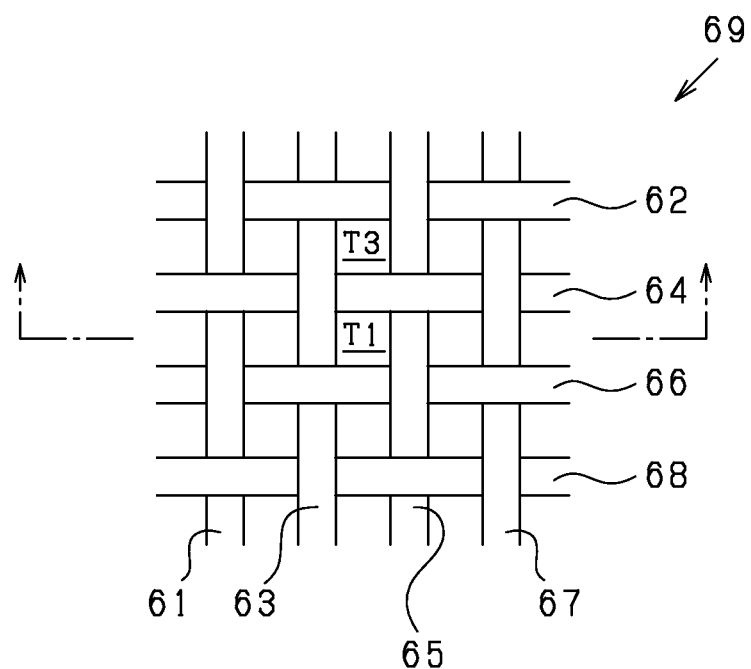
FIG. 11 is an enlarged plan view illustrating the configuration of a net-shaped body 69 forming a tubular mesh 60.

FIG. 11 is an enlarged plan view illustrating the configuration of the net-shaped body 69 forming the tubular mesh 60. The tubular mesh 60 is formed by using the net-shaped body 69 formed in a planar shape (flat-sheet shape). The net-shaped body 69 is formed by mutually knitting (weaving) vertical wires 61, 63, 65, and 67 and transverse wires 62, 64, 66, and 68 in a net-like shape. The vertical wires 61, 63, 65, and 67 and the transverse wires 62, 64, 66, and 68 are all formed from a material having wetting ability with respect to the liquid reagent.

In the present embodiment, a net-shaped body (the so-called 100 mesh) with a wire diameter (diameter of the vertical wire 61, transverse wire 62, etc.) of 0.1 mm and an inter-wire distance of 0.15 mm is used as the net-shaped body 69 (mesh). The net-shaped body 69 is arranged in a state of abutment against the vaporization surface 87. The wire diameter or inter-wire distance is preferably set to a suitable value according to the liquid reagent.

Mesh spaces (for example, mesh spaces T1 and T3) arranged regularly in the in-plane direction of the net-shaped body 69 are formed therein. The mesh space T1 is a square (planar) fine space (0.15 mm×0.15 mm) surrounded by two vertical wires 63 and 65 and two transverse wires 64 and 66. The mesh space T3 is a planar fine space surrounded by two vertical wires 63 and 65 and two transverse wires 62 and 64. The mesh space T1 is a fine space and therefore can suck in the liquid reagent and form a liquid reagent film by intermolecular forces between the liquid reagent and the wires 63, 64, 65, and 66 (capillary effect).

However, the inventors have found out that a function of spreading the liquid reagent and forming a thin film is insufficient because a structure that causes the liquid reagent to flow through by a capillary effect is not formed between the mutually adjacent mesh spaces (for example, the mesh space T1 and the mesh space T3). This is because the liquid reagent cannot be sufficiently induced to propagate in the plane of the net-shaped body 69. Thus, even when the liquid reagent is supplied to part of the net-shaped body 69, since the propagation speed of the liquid reagent is small, portions where the supply of the liquid reagent fails to reach due to evaporation appear. As a result, it was found out that the surface area of the liquid reagent film cannot be stabilized by the net-shaped body 69 alone (for example, the thin film does not spread widely or a spot-like thin film is formed due to evaporation).

Figure 12:
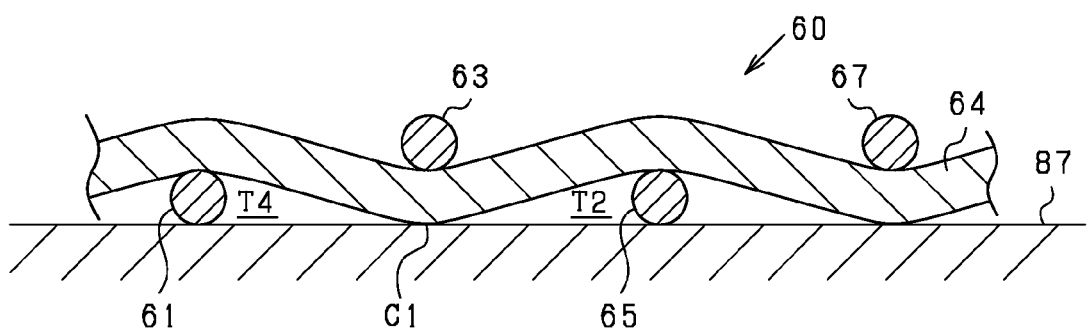
FIG. 12 is a cross-sectional view illustrating the configuration in the abutment state of the tubular mesh 60 and a vaporization surface 87.

FIG. 12 is a cross-sectional view illustrating the configuration of the abutment state of the tubular mesh 60 and the vaporization surface 87. The abutment of the tubular mesh 60 and the vaporization surface 87 forms liquid reagent supply spaces (for example, liquid reagent supply spaces T2 and T4) arranged regularly in the in-plane direction of the tubular mesh 60 (in-plane direction of the vaporization surface 87).

The liquid reagent supply space T2 is a space surrounded by the vaporization surface 87, vertical wires 65, and transverse wires 64. The liquid reagent supply space T2 is formed as a space closed by the abutment of the vaporization surface 87 and the vertical wire 65, the abutment of the vertical wire 65 and the transverse wire 64, and the abutment C1 of the transverse wire 64 and the vaporization surface 87. The liquid reagent supply space T4 is a space surrounded by the vaporization surface 87, vertical wire 61, and transverse wire 64. The liquid reagent supply space T4 is formed as a space closed by the abutment of the vaporization surface 87 and the vertical wire 61, the abutment of the vertical wire 61 and the transverse wire 64, and the abutment C1 of the transverse wire 64 and the vaporization surface 87.

The abutment force of the vaporization surface 87 and the vertical wire 61 and also the abutment force of the vaporization surface 87 and the vertical wire 65 are generated by the tension applied to the transverse wire 64. This is because the tension applied to the transverse wire 64 acts to move (push) the vertical wire 65 to (against) the vaporization surface 87 side and linearize the vertical wire. It is clear that the abutment of the vaporization surface 87 and each wire (the transverse wires and the vertical wires) acts according to the same mechanism at all positions.

The liquid reagent supply spaces T2 and T4 are formed by surrounding with the wires 61 and 65 and the vaporization surface 87 and are regularly arranged in the in-plane direction of the net-shaped body 69. Therefore, the liquid reagent can be uniformly supplied in the in-plane direction of the net-shaped body along the wires and the vaporization surface 87 and a state in which a uniform thin film of the liquid reagent is formed can be realized. The state in which a uniform thin film of the liquid reagent is formed is realized, mainly for the following two reasons, by uniformly supplying the liquid reagent in the in-plane-direction (two-dimensionally) of the net-shaped body 69 along the wires and the vaporization surface 87.

The first reason is that in positions at which the vertical wires 61, 63, 65, and 67 abut against the vaporization surface 87 (intersection positions of wires), the transverse wires 62, 64, 66, and 68 are separated from the vaporization surface 87, and conversely in positions at which the transverse wires 62, 64, 66, and 68 abut against the vaporization surface 87, the vertical wires 61, 63, 65, and 67 are separated from the vaporization surface 87, and the space for the liquid reagent to flow along the longitudinal directions of the wires is ensured. Meanwhile, since both the wires and the vaporization surface 87 have wetting ability, the flow along the longitudinal direction of the wires is realized due to the capillary effect generated along the gaps between the wires and the vaporization surface 87. As a result, the liquid reagent can smoothly flow along the longitudinal direction of each vertical wire or transverse wire.

The second reason is that at the intersection positions of the vertical wires and transverse wires, the liquid reagent flow can smoothly divide into the flow along the longitudinal wires and the flow along the transverse wires because the liquid reagent supply spaces are formed. Therefore, the liquid reagent can be supplied uniformly and two-dimensionally in the in-plane direction of the net-shaped body 69. As a result, the liquid reagent can be smoothly supplied in response to the decrease in the amount of the liquid reagent held in the liquid reagent holding spaces caused by the evaporation of the liquid reagent. Therefore, the state in which a uniform thin film of the liquid reagent is formed is maintained.

Thus, in the vaporizing unit 120 of the present embodiment, a thin film of the liquid reagent can be realized by the synergetic action of the liquid reagent supply spaces (liquid reagent supply function) and the mesh spaces (thin film maintaining function) arranged regularly in the in-plane direction of the net-shaped body 69, and the capillary effect is actuated such as to maintain the thin-film state of the liquid reagent even under the evaporation of the liquid reagent. The present feature is realized due to the regularity of the contour shape of the net-shaped body 69 formed in a planar shape by knitting the wires in a net-like shape.

Thus, in the net-shaped body 69, the mesh spaces are arranged regularly in the in-plane direction of the net-shaped body 69, and the liquid reagent supply path is ensured and branched in the liquid reagent supply spaces formed regularly in relation to the mesh spaces that are arranged regularly. Therefore, the formation of the uniform thin film by the capillary inflow and the uniform supply of the liquid reagent are realized. Conversely, since the liquid reagent supply spaces are not formed even if, for example, the mesh-shaped holes are formed in the film-shaped member, the effect of the present invention cannot be demonstrated.

Such a structure formed by the net-shaped body 69 and the vaporization surface 87 is contrary to the common technical knowledge of a person skilled in the art at the time of filing the present application. Using the net-shaped body 69 serving as the so-called mesh in a filter by utilizing the size of meshes in the mesh plane is the common technical knowledge of a person skilled in the art at the time of filing of the present application. However, the inventors have focused their attention on the structure (shape etc.) in the out-of-plane direction of the filter, created a novel structure by abutting this structure against the vaporization surface 87, and enabled the formation of a thin liquid reagent film that is required for vaporizing the liquid reagent and also the stable and large-quantity supply of the liquid reagent to the thin film.

Figure 13:
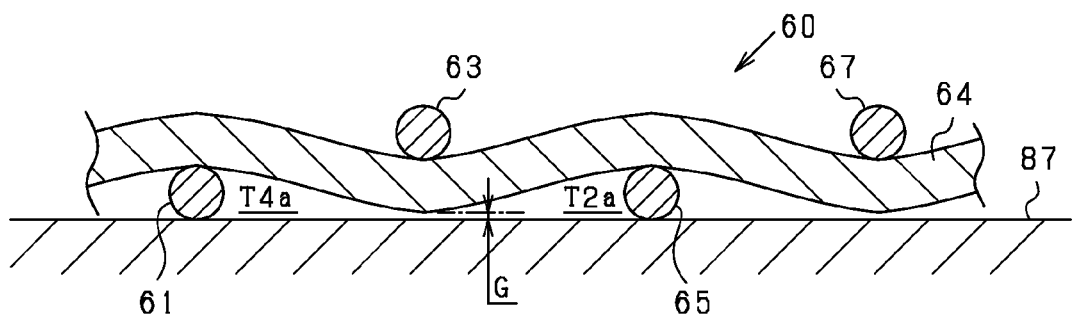
FIG. 13 is a cross-sectional view illustrating the configuration in the abutment state of the tubular mesh 60 and the vaporization surface 87.

FIG. 13 is a cross-sectional view illustrating the configuration of the abutment state of the tubular mesh 60 and the vaporization surface 87. More specifically, for example, spaces T2$a$ and T4$a$ that are formed in a partially opened state in which the wires are arranged regularly in the vicinity of the vaporization surface 87 and gaps G are formed are also included in the liquid reagent supply spaces. This is because the spaces surrounded in a partially opened state also generate the capillary effect. Thus, the liquid reagent supply spaces have a broad meaning, it is not always necessary that the closed spaces entirely surrounded by the wires and the vaporization surface 87 be formed, and the liquid reagent supply spaces may be partially opened.

The effects of the present embodiment are described below.

(1) A state in which a uniform thin film of the liquid reagent is formed can be realized by a plurality of mesh spaces, and the liquid reagent can be supplied uniformly and two-dimensionally by the liquid reagent supply spaces. As a result, a large vaporized amount obtained in a smooth manner can be realized with a small-size vaporizer.

(2) Since the supply and vaporization of the liquid reagent are realized by the planar structure of the vaporization surface and the net-shaped body, the problem of degradation of the liquid reagent retained inside a three-dimensional structure is avoided, by contrast with the method by which the surface area of liquid reagent is increased, for example, by a three-dimensional structure (for example, a foamed body).

(3) Since the planar structure of the vaporization surface and the net-shaped body is provided, no useless portions are present when a thin film is formed, and the volume efficiency is high. As a result, size reduction can be realized and therefore the vaporizer can be disposed in the vicinity of the chamber where a wafer is stored.

(4) The degradation of the liquid reagent occurring in a state (for example, bubbling) in which the liquid reagent is continuously exposed to a gaseous medium (nitrogen gas) can be prevented. This is because in the present embodiment, the liquid reagent does not come into contact with the gaseous medium till immediately before the vaporization.

(5) The vaporizer can be easily configured by the vaporization surface and the net-shaped body.

Configuration of Liquid Vaporizer of the Second Embodiment

Figure 14A:
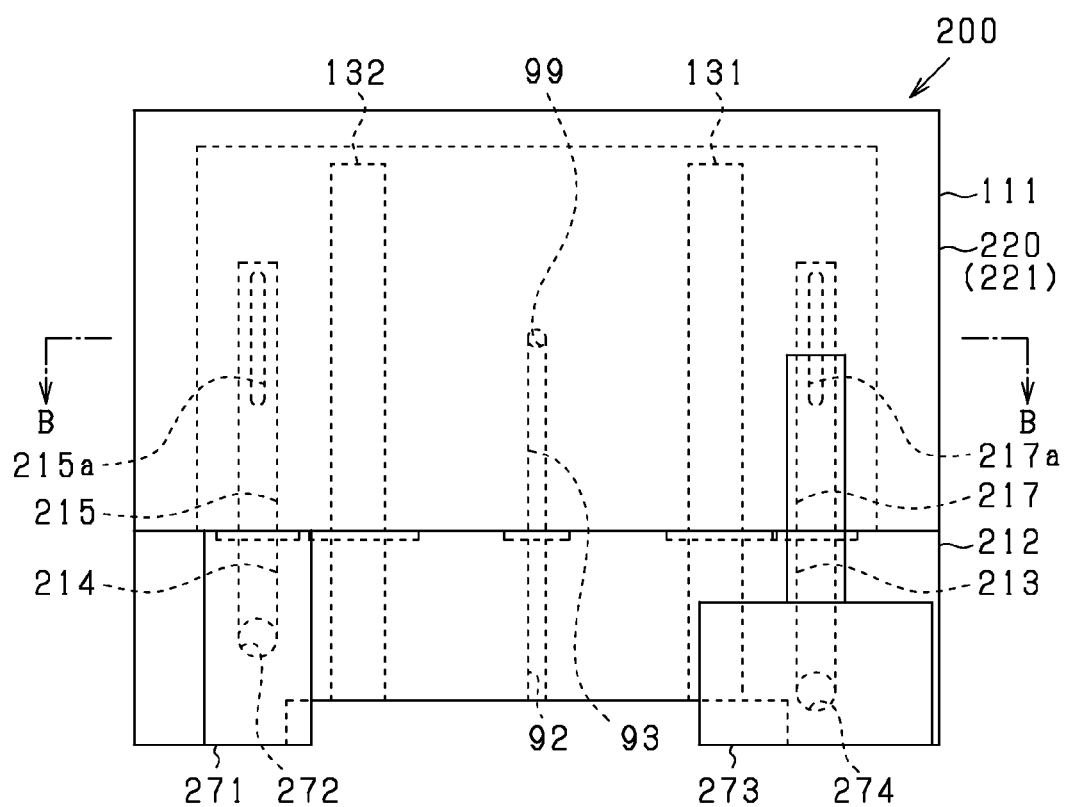
FIGS. 14A and 14B show the configuration of a liquid vaporizer 200.
Figure 14B:
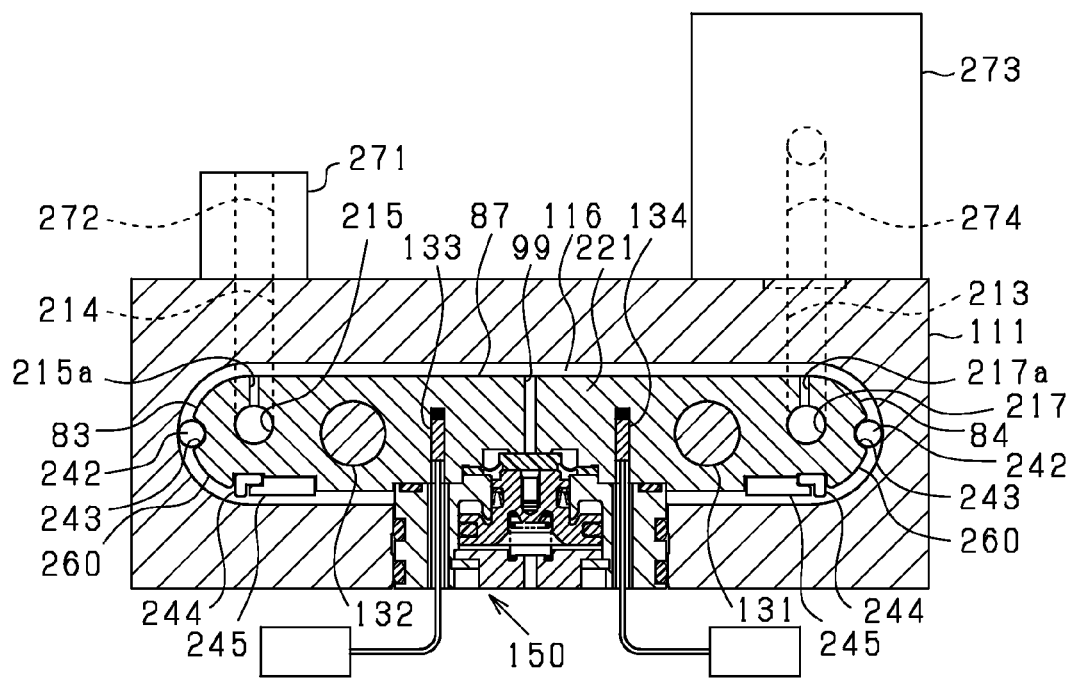

FIG. 14 illustrates the configuration of a liquid vaporizer 200. FIG. 14A is a top view of the liquid vaporizer 200, and FIG. 14B is a cross-sectional view taken along the B-B line in FIG. 14A. In the liquid vaporizer 100 of the first embodiment, the nitrogen gas supply port 115a (gas introducing port) and the mixed gas discharge port 117a (gas discharge port) are provided in the main vaporizer body 110, but in the liquid vaporizer 200 of the second embodiment, a nitrogen gas supply port 215a (gas introducing port) and a mixed gas discharge port 217a (gas discharge port) are provided in the main vaporizing unit body 221. Further, the nitrogen gas is introduced in the mixed gas generating space 116 from the nitrogen gas supply port 215a, and the mixed gas is discharged from the mixed gas discharge port 217a. The components same as those of the first embodiment are assigned with the same reference numerals and the explanation thereof is herein omitted.

A first block 271 and a second block 273 are attached to a lid member 212. A nitrogen gas introducing flow channel 272 is provided inside the first block 271, and a mixed gas discharge flow channel 274 is provided inside the second block 273. The nitrogen gas is introduced from the nitrogen gas introducing flow channel 272, and the mixed gas is discharged from the mixed gas discharge flow channel 274.

A nitrogen gas flow channel 214 is provided inside the lid member 212, and the nitrogen gas introducing flow channel 272 is connected to the nitrogen gas flow channel 214. The nitrogen gas flow channel 214 extends by curving from the direction perpendicular to the axial line direction of a vaporizing unit 220 to the axial line direction and is open at the end surface of the lid member 212 on the recessed member 111 side. Further, a mixed gas flow channel 213 is provided inside the lid member 212, and the mixed gas discharge flow channel 274 is connected to the mixed gas flow channel 213. The mixed gas flow channel 213 extends by curving from the direction perpendicular to the axial line direction of a vaporizing unit 220 to the axial line direction and is open at the end surface of the lid member 212 on the recessed member 111 side.

A nitrogen gas flow channel 215 (gaseous medium flow channel) through which the nitrogen gas is caused to flow is provided inside the main vaporizing unit body 221, and the nitrogen gas flow channel 214 is connected to the nitrogen gas flow channel 215. The nitrogen gas flow channel 215 extends in the axial line direction of the main vaporizing unit body 221 and is provided along a heater 132 (heating unit) that heats the vaporization surface 87 from inside the main vaporizing unit body 221. More specifically, the nitrogen gas flow channel 215 is provided parallel to the heater 132 at the side of the heater 132. Further, a mixed gas flow channel 217 (mixed gas flow channel) through which the mixed gas is caused to flow is provided inside the main vaporizing unit body 221, and the mixed gas flow channel 213 is connected to the mixed gas flow channel 217. The mixed gas flow channel 217 extends in the axial line direction of the main vaporizing unit body 221 and is provided along a heater 131 (heating unit) that heats the vaporization surface 87 from inside the main vaporizing unit body 221. More specifically, the mixed gas flow channel 217 is provided parallel to the heater 131 at the side of the heater 131.

The nitrogen gas flow channel 215 and the mixed gas flow channel 217 extend close to the center of the main vaporizing unit body 221 in the axial line direction of the main vaporizing unit body 221 and respectively open at the vaporization surface 87 through the nitrogen gas supply port 215a and the mixed gas discharge port 217a that face the vaporization surface 87. The liquid reagent discharge port 99 is disposed between the nitrogen gas supply port 215a and the mixed gas discharge port 217a. The nitrogen gas supply port 215a and the mixed gas discharge port 217a have an elliptical cross-sectional shape, with a longitudinal direction in the axial line direction of the main vaporizing unit body 221. Therefore, the nitrogen gas flowing from the nitrogen gas supply port 215a to the mixed gas discharge port 217a in the direction perpendicular to the axial line direction of the main vaporizing unit body 221 is easily diffused in the axial line direction of the main vaporizing unit body 221. Further, the nitrogen gas and mixed gas that have been diffused in the axial line direction of the main vaporizing unit body 221 are easily collected in the mixed gas discharge port 217a.

With such a configuration, the temperature of the main vaporizing unit body 221 is raised by heating the vaporization surface 87 with the heaters 131 and 132. The nitrogen gas is heated while passing through the nitrogen gas flow channel 215 and introduced from the nitrogen gas supply port 215a into the mixed gas generating space 116. Further, the mixed gas discharged from the mixed gas discharge port 217a is heated while flowing through the mixed gas flow channel 217. Since the nitrogen gas flow channel 215 and the mixed gas flow channel 217 are provided along the heaters 132 and 131, respectively, the temperature of the nitrogen gas flow channel 215 and the mixed gas flow channel 217 can be raised efficiently.

Figure 15A:
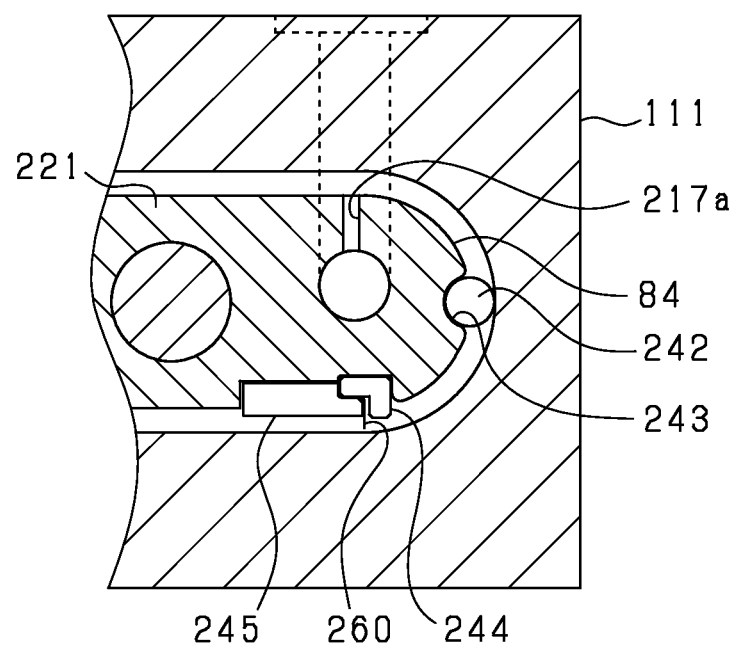
FIGS. 15A and 15B are enlarged views illustrating the fixed state of a mesh 260.
Figure 15B:
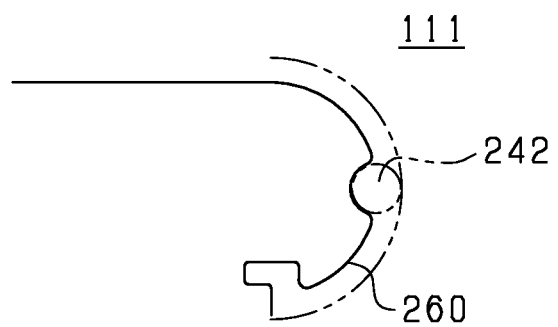

Further, as shown in FIG. 15A, recesses 243 are formed so as to extend linearly in the axial line direction of the main vaporizing unit body 221 in the outer circumferential surfaces 83 and 84 (only the outer circumferential surface 84 is shown in FIG. 15) formed by curved surfaces included the outer circumferential surfaces of the main vaporizing unit body 221. A mesh 260 is wound on the main vaporizing unit body 221, and the end portion of the mesh 260 is sandwiched between a pressing member 244 and the main vaporizing unit body 221. The pressing member 244 is fixed by a fixing member 245 to the main vaporizing unit body 221. The end portion of the mesh 260 is guided to the outside from between the pressing member 244 and the fixing member 245. With such a fixing structure, it is not necessary to form a hole for attaching the mesh 260 and the configuration of the mesh 260 can be simplified. When the mesh 260 is wound on the main vaporizing unit body 221, the mesh 260 is tensioned to prevent loosening, while pressing the mesh with the pressing member 244. The pressing member 244 is fixed to the main vaporizing unit body 221 by the fixing member 245. As a result, a state is assumed in which the mesh 260 is brought into a substantially close contact with the main vaporizing unit body 221. FIG. 15B only shows the mesh 260 removed from the main vaporizing unit body 221.

In a state in which the mesh 260 is thus wound on and fixed to the outer circumferential surface of the main vaporizing unit body 221, a gap appears between the mesh 260 and the above-mentioned recess 243. Accordingly, an insertion member 242 is inserted from the axial line direction of the main vaporizing unit body 221 between the recessed member 111 and the mesh 260 so as to engage with the recess 243. The insertion member 242 is formed in a round rod shape, and the radius of the cross section of the insertion member 242 is substantially equal to the curvature radius of the recess 243. The distal end portion of the insertion member 242 is somewhat tapered with respect to the other portion of the insertion member 242, and the insertion member 242 is inserted from the distal end portion, while pressing the mesh 260 against the recess 243. Therefore, the gap between the recess 243 and the mesh 260 is reduced, and tension can be generated in the mesh 260 along the outer circumferential direction of the main vaporizing unit body 221. As a result, wrinkles in the mesh 260 are removed, and a state is assumed in which the mesh 260 is stronger attached closely to the main vaporizing unit body 221.

The effects of the present embodiment are described below. In this case, only the effects that are different from those of the first embodiment are described.

(1) The nitrogen gas is heated while passing through the nitrogen gas flow channel 215, and introduced from the nitrogen gas supply port 215a to the mixed gas generating space 116. Therefore, the vaporization of the liquid reagent can be enhanced.

(2) The mixed gas discharged from the mixed gas discharge port 217a is heated while flowing through the mixed gas flow channel 217. Therefore, condensation of the mixed gas can be inhibited.

(3) Since the nitrogen gas flow channel 215 and the mixed gas flow channel 217 are provided along the heaters 132 and 131, respectively, the heating of the nitrogen gas passing through the nitrogen gas flow channel 215 and the heating of the mixed gas passing through the mixed gas flow channel 217 can be further enhanced.

(4) The cross section of the nitrogen gas supply port 215a and the mixed gas discharge port 217a has an elliptical shape with a longitudinal direction in the axial line direction of the main vaporizing unit body 221. As a result, the nitrogen gas is easily diffused in the axial line direction of the main vaporizing unit body 221, and the nitrogen gas and the mixed gas are easily collected in the mixed gas discharge port 117a.

(5) Tension can be generated in the mesh 260 along the outer circumferential surface of the main vaporizing unit body 221 by a simple configuration, and the displacement of the insertion member 242 can be inhibited by the recess 243.

Other Embodiments

The present invention is not limited to the abovementioned embodiments and may be also implemented, for example, in the following manner.

(1) In the abovementioned embodiments, the cross-sectional shape of the wires is a true circle, but it should not necessarily be a true circle and may be elliptical or polygonal (tetragonal or hexagonal).

(2) In the abovementioned embodiments, the net-shaped body (mesh) 69 made from stainless steel and having a 100-mesh coarseness is used, but net-shaped bodies of other coarseness may be also used, the net-shaped body should not necessarily be made from stainless steel, and a mesh constituted by another metal may be used. The net-shaped body should not necessarily be metallic, and a mesh made from a resin constituted by a fluororesin or the like may be also used. The material and coarseness of the net-shaped body can be set, as appropriate, according to the properties of the liquid reagent such as wetting ability and viscosity of the liquid reagent to be vaporized.

(3) In the abovementioned embodiments, the mesh spaces have a square shape, but they may also have, for example, a hexagonal shape or a rhomboidal shape.

(4) In the abovementioned embodiments, the mode of knitting the net-shaped body is plain weaving in which the wires cross each other, with each row alternating, but another knitting mode (weaving mode) such as twill weaving may be also used. In accordance with the present invention, general net-shaped bodies formed in a planar shape by knitting the wires regularly in a net-like shape can be used.

Further, in the above-described embodiments, the pitch of the vertical wires and transverse wires is the same, but for example, the pitch of the transverse wires may be made less than the pitch of the vertical wires. In such a case, the rate of capillary inflow can be changed (adjusted) according to the direction.

(5) In the abovementioned embodiments, the abutment of the net-shaped body and the vaporization surface is realized by applying tension to the net-shaped body, but the abutment may be also generated by a method of applying, for example, a magnetic force (a magnetic mesh is used), an adhesive force, or a pressure created by a coarse structural member.

(6) In the abovementioned embodiments, the liquid reagent discharge port is formed in the vaporization surface, but the liquid reagent may be also supplied, for example, from the side of the columnar recess 119 (side opposite that of the vaporization surface). However, when the liquid reagent is supplied from the side opposite that of the vaporization surface, it is preferred that the liquid reagent discharge port be disposed in an out-of-plane direction of the net-shaped body at a distance from the net-shaped body which is less than the diameter of liquid reagent droplets formed by the surface tension in the liquid reagent discharge port.

As a result, it is possible to inhibit the generation of particles caused by the adhesion of the liquid reagent to the circumference of the liquid reagent supply port that is induced by the liquid droplets formed at the distal end of the liquid reagent supply port. This is because the net-shaped body can inhibit the generation of large liquid droplets by attracting the liquid reagent by the capillary effect.

(7) In the abovementioned embodiments, the present liquid vaporizing system 10 is used in a semiconductor production line, but the system can be also used in other production lines. Further, in the abovementioned embodiments, the present liquid vaporizing system 10 is used for vaporizing a hexamethyldisilazane liquid (HMDS liquid) as a liquid material, but the system may be also used for vaporizing other liquid materials such as tetramethylcyclotetrasiloxane (TMCTS).

What is claimed is:

1. A liquid vaporizer configured to vaporize a liquid reagent supplied from a liquid reagent supply port and mix the vaporized liquid reagent with a gaseous medium, the liquid vaporizer comprising:

a main vaporizer body having a gas introducing port for introducing the gaseous medium, a mixed gas generating space for generating a mixed gas by mixing the vaporized liquid reagent with the gaseous medium introduced from the gas introducing port, and a gas discharge port for discharging the mixed gas; and a vaporizing unit disposed inside the mixed gas generating space and configure to vaporize the supplied liquid reagent, wherein the vaporizing unit has a main vaporizing unit body having the liquid reagent supply port and a vaporization surface formed on the main vaporizing unit body and a net-shaped body formed in a planar shape by knitting wires regularly in a net-like shape, the net-shaped body forms a plurality of mesh spaces surrounded by the wires and arranged regularly in an in-plane direction of the net-shaped body, and the vaporizing unit forms a plurality of liquid reagent supply spaces surrounded by the wires and the vaporization surface as a result of the net-shaped body and the vaporization surface being abutted against each other, the liquid reagent supply spaces being arranged regularly in the in-plane direction of the net-shaped body.

2. The liquid vaporizer according to claim 1, wherein
the vaporization surface is formed as part of an outer circumferential surface of a columnar body, and
the net-shaped body is wound along an outer circumferential of the columnar body.

3. The liquid vaporizer according to claim 2, wherein
the vaporizing unit has a tension generating unit configured to generate tension in the net-shaped body along the outer circumferential direction of the columnar body.

4. The liquid vaporizer according to claim 3, wherein the tension generating unit has a recess formed in the outer circumferential surface of the columnar body so as to extend linearly in an axial line direction of the columnar body, and an insertion member inserted between the main vaporizer body and the net-shaped body so as to engage with the recess.

5. The liquid vaporizer according to claim 1, wherein
the vaporization surface includes a continuous curved surface formed by connection of convex surfaces protruding in an out-of-plane direction of the net-shaped body, and
in the vaporizing unit, the net-shaped body and the vaporization surface are abutted against each other by generating tension with respect to the net-shaped body along the continuous curved surface.

6. The liquid vaporizer according to claim 5, the vaporization surface further including:
a liquid reagent supply surface formed as a flat surface to which the liquid reagent is supplied; and
a pair of the continuous curved surfaces connected to the flat surface at positions sandwiching the liquid reagent supply surface, wherein
in the vaporizing unit, the flat surface sandwiched by the pair of continuous curved surfaces and the net-shaped body are abutted against each other by generating tension with respect to the net-shaped body along the pair of continuous curved surfaces.

7. The liquid vaporizer according to claim 1, wherein
the liquid reagent supply port is a liquid reagent discharge port for supplying the liquid reagent to the vaporization surface, and is formed in the vaporization surface abutting against the net-shaped body.

8. The liquid vaporizer according to claim 7, wherein
the main vaporizing unit body has a heating unit inside the main vaporizing unit body.

9. The liquid vaporizer according to claim 7, wherein
the main vaporizing unit body has:
a control valve configured to control the supply of the liquid reagent to the liquid reagent discharge port;
a liquid reagent discharge flow channel connecting the liquid reagent discharge port to the control valve; and a plurality of heating units disposed at positions sandwiching the liquid reagent discharge flow channel.

10. The liquid vaporizer according to claim 9, wherein
the main vaporizer body has an outer tubular section forming the mixed gas generating space as a columnar space of a first columnar shape,
the main vaporizing unit body has an inner tubular section disposed inside the mixed gas generating space, the inner tubular section having a contour of a second columnar shape with an axial line parallel to an axial line of the first columnar shape, and being formed with a liquid reagent supply flow channel in the axial line direction of the second columnar shape,
a valve actuator mounted on the inner tubular section through the outer tubular section is provided, and
the valve actuator has a valve element configured to control a communication state of the liquid reagent supply flow channel and the liquid reagent discharge flow channel.

11. The liquid vaporizer according to claim 10, wherein
the liquid reagent discharge port is disposed between the gas introducing port and the gas discharge port in the axial line direction of the first columnar shape.

12. The liquid vaporizer according to claim 11, wherein the gas discharge port is disposed at a position such that at least part of the gas discharge port communicates with a space formed in a gap between a bottom surface of the mixed gas generating space of the columnar space of the first columnar shape and a bottom surface of the main vaporizing unit body in the axial line direction of the first columnar shape.

13. The liquid vaporizer according to claim 1, wherein
the liquid reagent supply port is a liquid reagent discharge port for supplying the liquid reagent to the vaporization surface, and is disposed at a position separated from the net-shaped body by a predetermined distance in an out-of-plane direction of the net-shaped body, and
the predetermined distance is a distance less than a diameter of a droplet of the liquid reagent formed by surface tension in the liquid reagent discharge port.

14. A liquid vaporizer configured to vaporize a liquid reagent supplied from a liquid reagent supply port and mix the vaporized liquid reagent with a gaseous medium, the liquid vaporizer comprising:
a main vaporizer body having a mixed gas generating space for generating a mixed gas by mixing the vaporized liquid reagent with the gaseous medium; and
a vaporizing unit disposed inside the mixed gas generating space and configured to vaporize the supplied liquid reagent, wherein
the vaporizing unit has a main vaporizing unit body having the liquid reagent supply port and a vaporization surface formed on the main vaporizing unit body and a net-shaped body formed in a planar shape by knitting wires regularly in a net-like shape,
the main vaporizing unit body has a heating unit configured to heat the vaporization surface from inside the main vaporizing unit body, a gaseous medium flow channel through which the gaseous medium is caused to flow, a gas introducing port for introducing the gaseous medium flowing through the gaseous medium flow channel into the mixed gas generating space, a gas discharge port for discharging the mixed gas from the mixed gas generating space, and a mixed gas flow channel through which the mixed gas discharged from the gas discharged port is caused to flow,
the net-shaped body forms a plurality of mesh spaces surrounded by the wires and arranged regularly in an in-plane direction of the net-shaped body, and the vaporizing unit forms a plurality of liquid reagent supply spaces surrounded by the wires and the vaporization surface as a result of the net-shaped body and the vaporization surface being abutted against each other, the liquid reagent supply spaces being arranged regularly in the in-plane direction of the net-shaped body.

15. The liquid vaporizer according to claim 14, wherein the gaseous medium flow channel and the mixed gas flow channel are provided along the heating unit.

16. The liquid vaporizer according to claim 14, wherein the liquid reagent supply port is a liquid reagent discharge port for supplying the liquid reagent to the vaporization surface, and wherein the liquid reagent discharge port is disposed between the gas introducing port and the gas discharge port.

* * * * *